(12) United States Patent
Kurooka et al.

(10) Patent No.: US 6,184,088 B1
(45) Date of Patent: Feb. 6, 2001

(54) METHOD FOR MANUFACTURING A SPLIT GAME TYPE TRANSISTOR

(75) Inventors: Kazumi Kurooka, Gifu; Kenji Fukase, Ogaki, both of (JP)

(73) Assignee: Sanyo Electric Co., Ltd., Osaka (JP)

( * ) Notice: Under 35 U.S.C. 154(b), the term of this patent shall be extended for 0 days.

(21) Appl. No.: 09/258,243

(22) Filed: Feb. 25, 1999

Related U.S. Application Data

(62) Division of application No. 08/825,109, filed on Mar. 27, 1997, now Pat. No. 5,936,883.

(30) Foreign Application Priority Data

Mar. 29, 1996 (JP) ......................................................... 8-77145

(51) Int. Cl.$^7$ .............................................. H01L 21/8247
(52) U.S. Cl. ......................... 438/264; 438/266; 438/594
(58) Field of Search ...................... 438/257–267, 438/593–594

(56) References Cited

U.S. PATENT DOCUMENTS

| | | | |
|---|---|---|---|
| 5,029,130 | | 7/1991 | Yeh ........................................ 365/185 |
| 5,360,751 | * | 11/1994 | Lee . |
| 5,371,028 | * | 12/1994 | Koh . |
| 5,460,992 | * | 10/1995 | Hasegawa . |
| 5,633,184 | * | 5/1997 | Tamura et al. ......................... 438/264 |
| 5,847,427 | * | 12/1998 | Hagiwara .............................. 257/324 |
| 5,858,840 | * | 1/1999 | Hsieh et al. ........................... 438/266 |
| 6,001,713 | * | 12/1999 | Ramsbey et al. ...................... 438/520 |
| 6,040,216 | * | 3/2000 | Sung ..................................... 438/257 |
| 6,069,041 | * | 5/2000 | Tanigami et al. ..................... 438/261 |
| 6,071,777 | * | 6/2000 | Chen .................................... 438/257 |

FOREIGN PATENT DOCUMENTS

PCT/US92/02194   3/1992 (WO) .

OTHER PUBLICATIONS

Electronics Letters; Aug. 30, 1990; vol. 26, No. 18; Highly Reliable Thin Nitrided SIO$_2$ Films Formed by Rapid Thermal Processing an N$_2$O Abient.

High Performance Dual–gate Sub–halfmicron CMOSFETs with 6 nm–thick Nitrided SiO$_2$ Films in an N$_2$O Ambient; 1990.

High–Performance Scaled Flash–Type EEPROMs with Heavily Oxynitrided Tunnel Oxide Films; 1992.

Oki Electric Research and Development Report, published on Oct. 1993; Oxynitrided Tunnel–Oxide Film for Flash– Memory.

* cited by examiner

*Primary Examiner*—Richard Booth
(74) *Attorney, Agent, or Firm*—Sheridan Ross P.C.

(57) ABSTRACT

A method for manufacturing a split gate type transistors includes the steps of: forming a semiconductor substrate; forming a floating gate electrode over the semiconductor substrate, the floating gate electrode having at least one lateral face portion; and nitrating the at least one lateral face portion to form a nitrogen-containing layer.

17 Claims, 23 Drawing Sheets

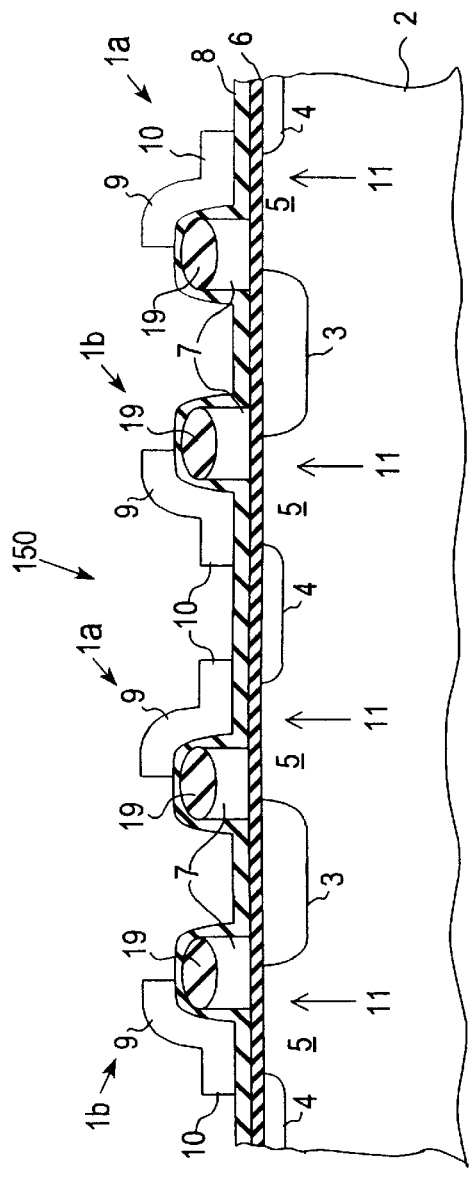
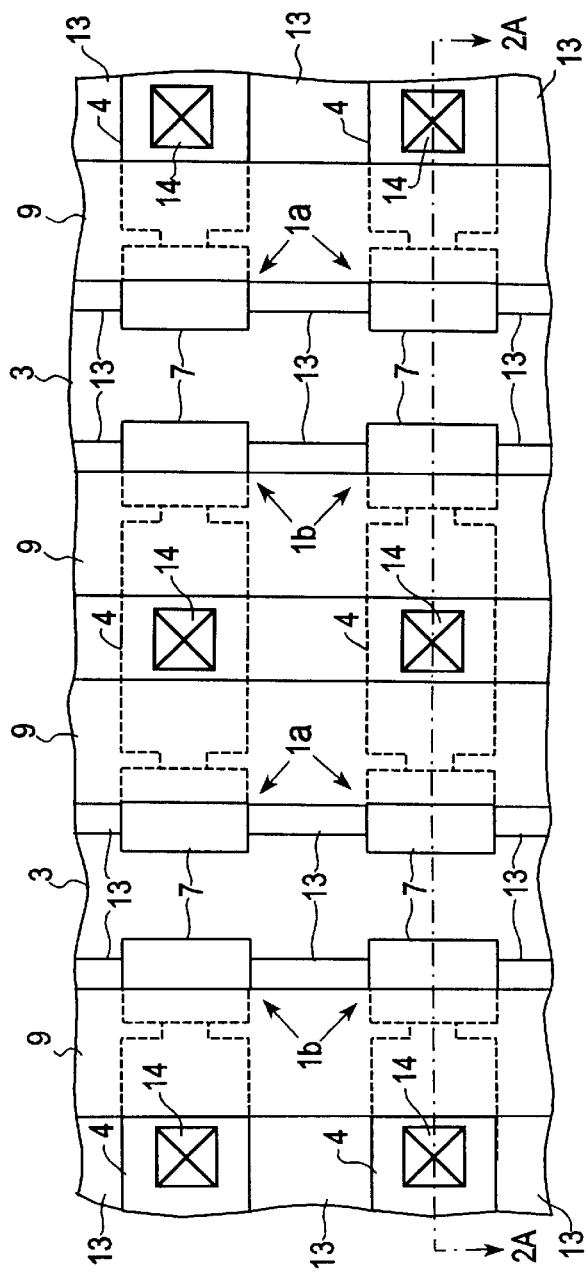
Fig. 2A
(Prior Art)
Fig. 2B
(Prior Art)

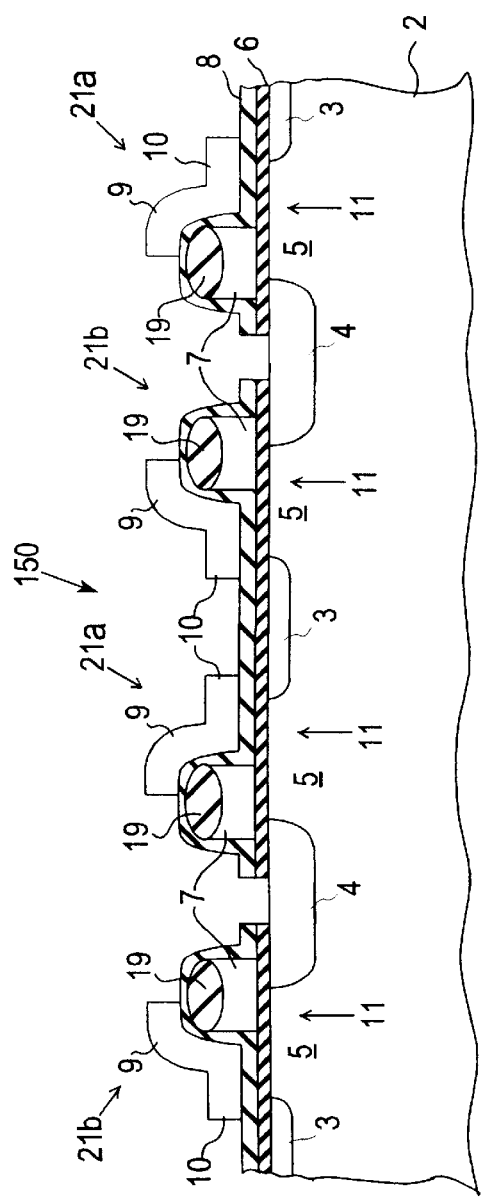
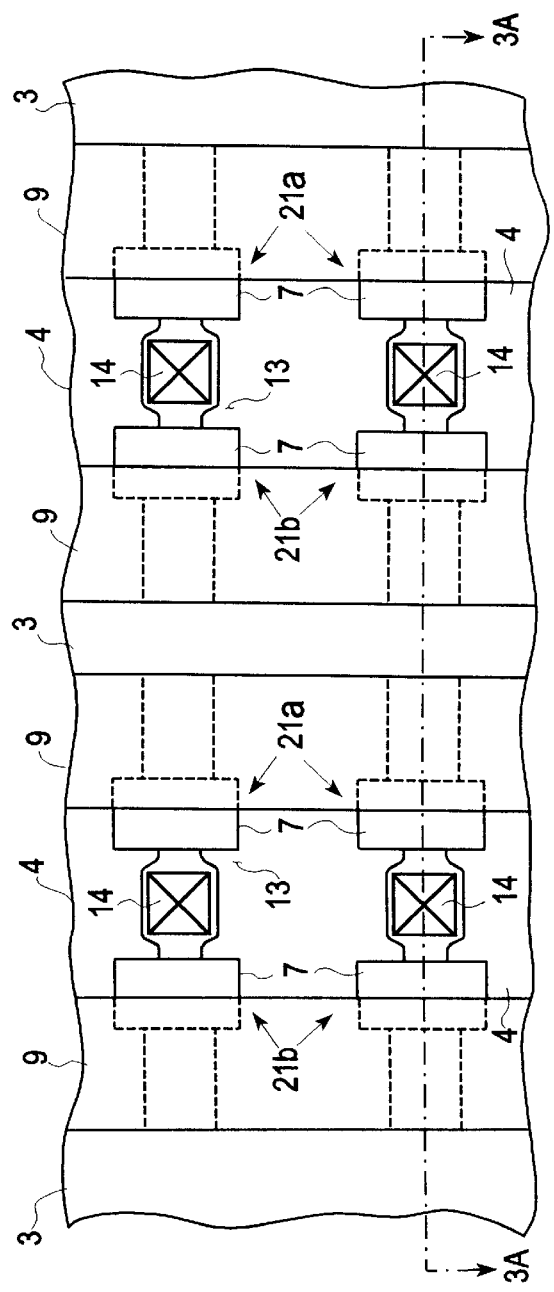
Fig. 3A
(Prior Art)
Fig. 3B
(Prior Art)

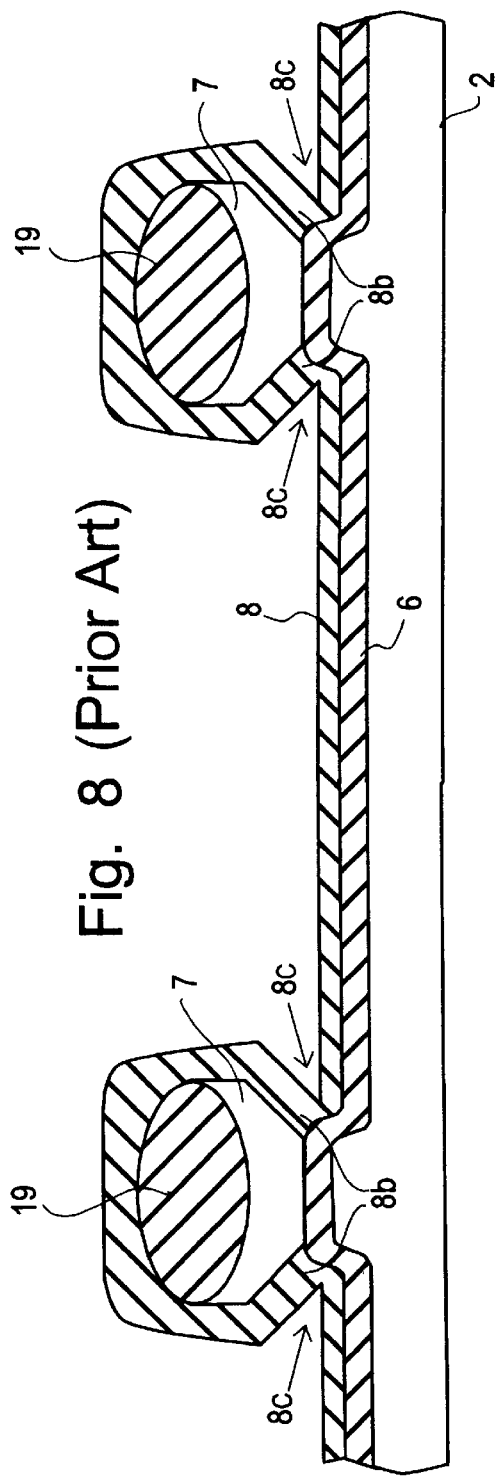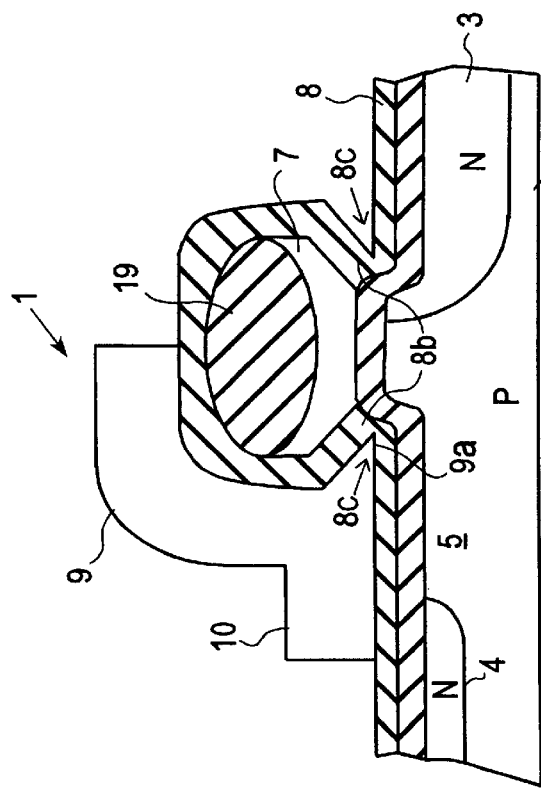

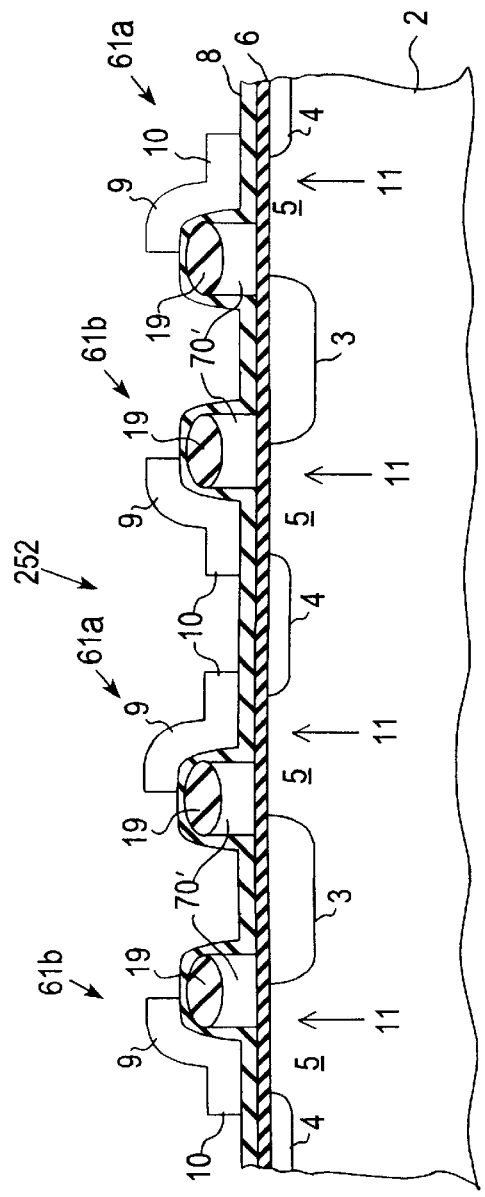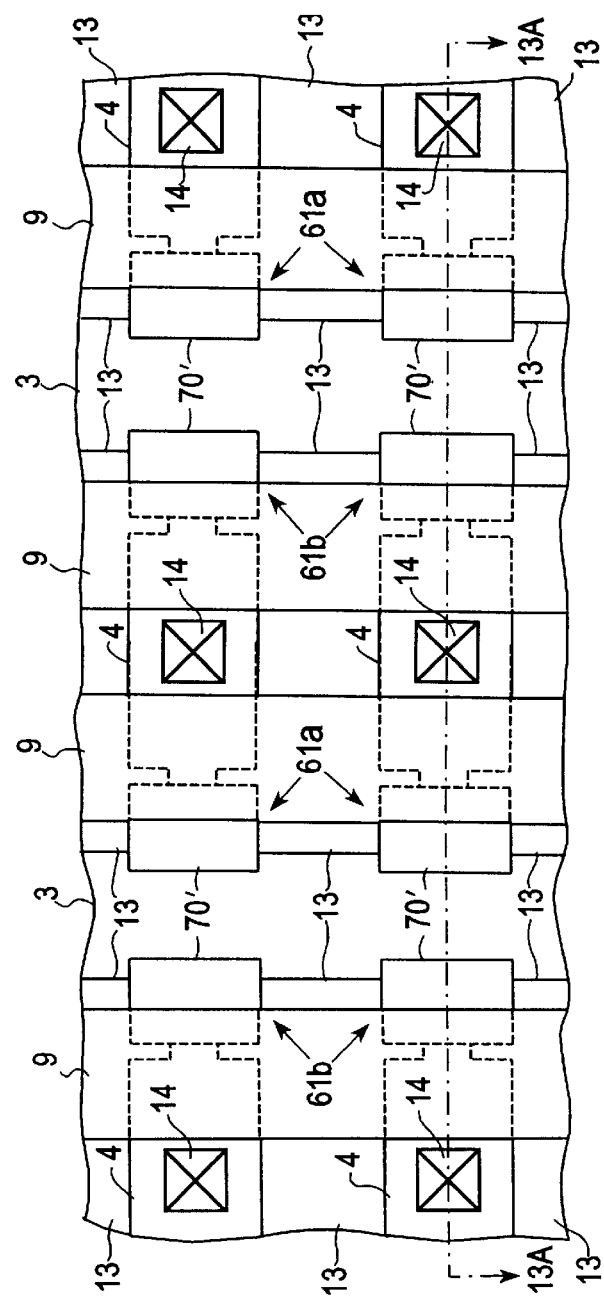
Fig. 13A
Fig. 13B

Fig. 18

| OPERATION MODE | WRITE | ERASE | READ | STANDBY |
|---|---|---|---|---|
| WORD LINE WLm (CONTROL GATE ELECTRODE 9) | +2V | +14V TO +15V | +4V | 0V |
| BIT LINE BLm (DRAIN REGION 4) | 0V | 0V | +2V | 0V |
| COMMON SOURCE LINE SL (SOURCE REGION 3) | +12V | 0V | 0V | 0V |
| SUBSTRATE 2 | 0V | 0V | 0V | 0V |

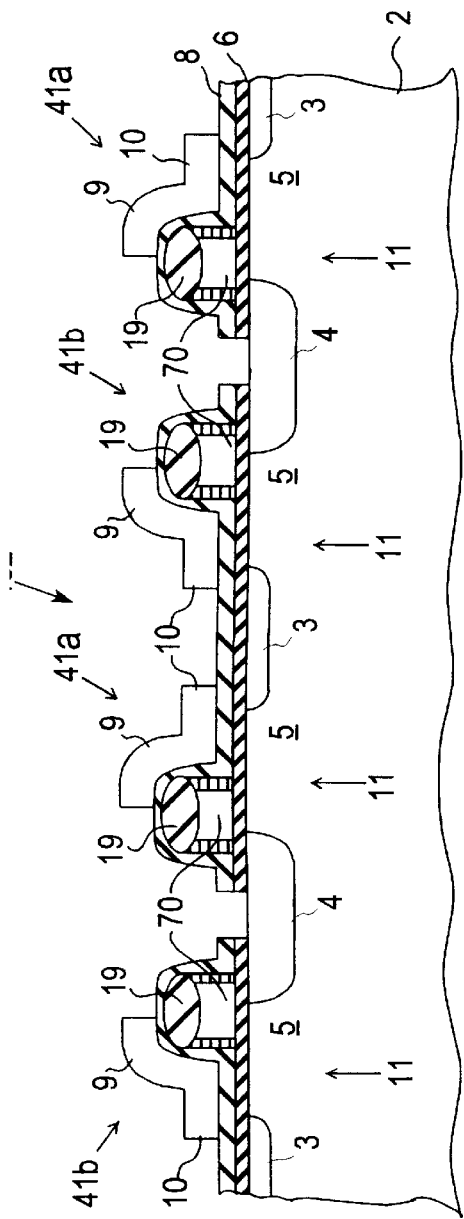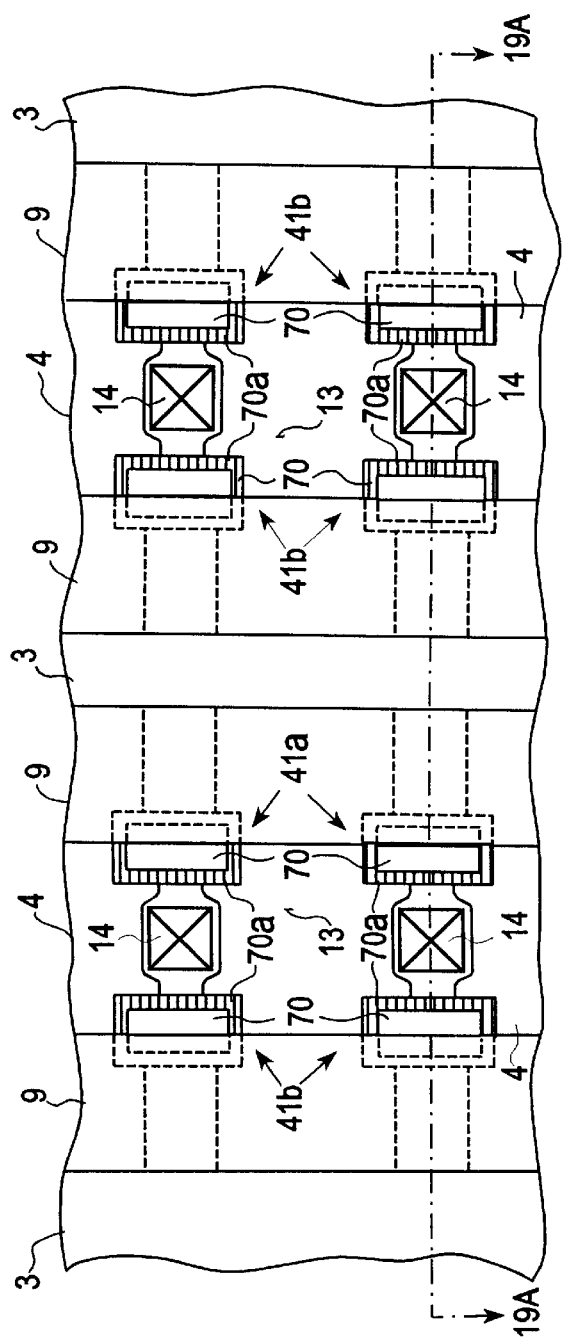
Fig. 19A
Fig. 19B

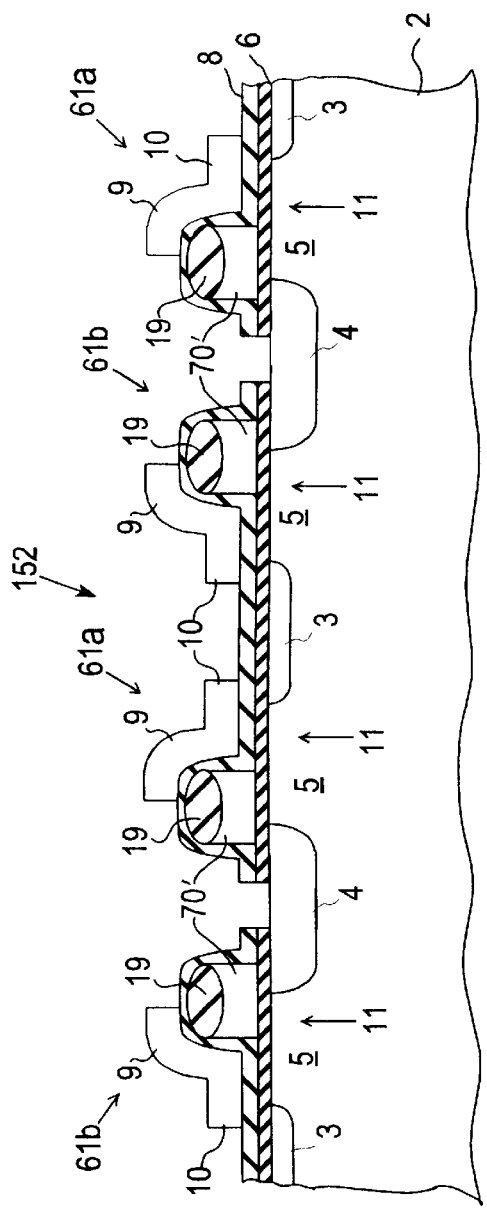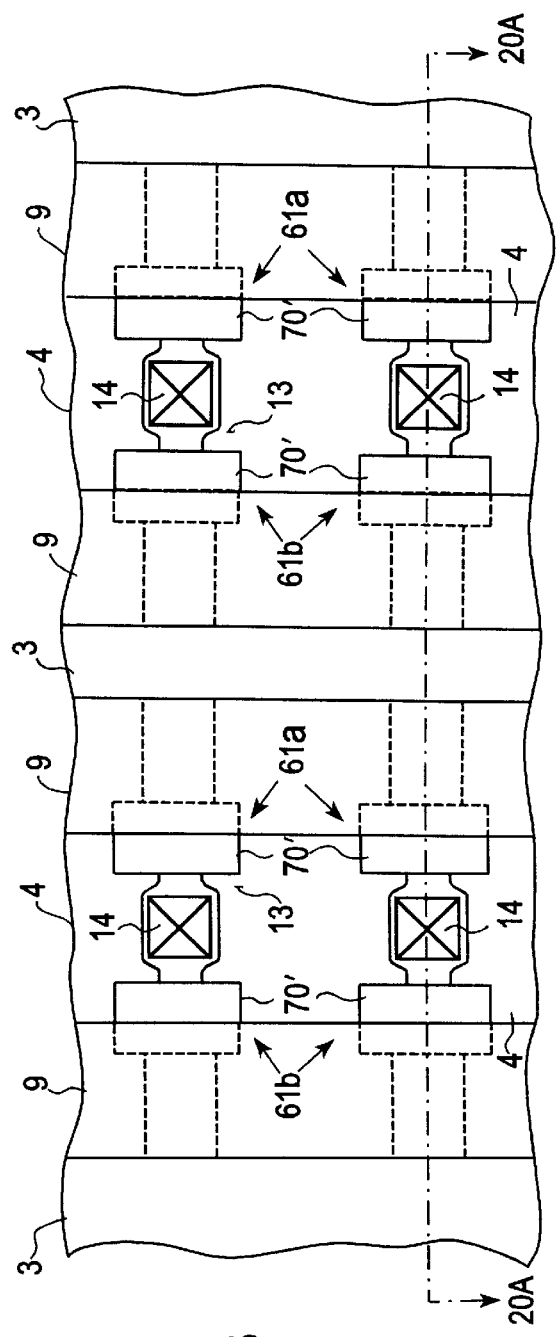
Fig. 20A
Fig. 20B

Fig. 22

| OPERATION MODE | WRITE | ERASE | READ | STANDBY |
|---|---|---|---|---|
| WORD LINE WLm (CONTROL GATE ELECTRODE 9) | +2V | +14V TO +15V | +4V | 0V |
| BIT LINE BLm (DRAIN REGION 4) | +12V | 0V | +2V | 0V |
| COMMON SOURCE LINE SL (SOURCE REGION 3) | 0V | 0V | 0V | 0V |
| SUBSTRATE 2 | 0V | 0V | 0V | 0V |

METHOD FOR MANUFACTURING A SPLIT GAME TYPE TRANSISTOR

This application is a division of U.S. patent application Ser. No. 08/825,109, filed Mar. 27. 1997, now U.S. Pat. No. 5,936,883.

BACKGROUND OF THE INVENTION

1. Field of the Invention

The present invention relates generally to a split gate type transistor and a method for manufacturing the same. Particularly, the present invention relates to a split gate type transistor employable as memory cells in non-volatile semiconductor memory devices and also to a method for manufacturing the same.

2. Description of the Related Art

Recently, non-volatile semiconductor memory devices such as ferro-electric Random Access Memory, Erasable and Programmable Read Only Memory (EPROM) and EEPROM have become increasingly popular. EPROMs and EEPROMs have a plurality of memory cells having floating gates and control gates. EEPROMs include flash EEPROMs which can perform data erasure for all of the memory cells or partial data erasure for each of a plurality of block memory cells. Split gate type cells and stacked gate type cells are present in the memory cells of the flash EEPROM.

In the flash EEPROM, the stacked gate type memory cell has no selector transistor, and thus it cannot make an ON-OFF selection by itself. Accordingly, when excess charges are extracted from the floating gate electrode in performing data erasure, a problem of excess erasure arises. For example, even if 0V is applied to control gate electrodes so as to deenergize the memory cells, those memory cells which were subject to excess erasure are energized. Consequently, electric current constantly flows into the memory cells making it impossibe to read data stored in the memory cells. In order to prevent such excess erasure from occurring, the erasing procedures in the memory device are preferably controlled precisely by a peripheral circuit or an external circuit.

Split gate type memory cells include a selector transistor which obviates the problem of excess erasure. International Patent Publication WO92/18980 discloses a flash EEPROM employing split gate type memory cells.

FIG. 1 is a schematic cross-sectional view of an example of a prior art split gate type memory cell 1. The split gate type memory cell (split gate type transistor) 1 has an N-type conductive source area 3 and an N-type conductive drain area 4 which are defined on a P-type conductive single crystal silicon substrate 2, a floating gate 7 disposed on a gate insulating film 6 on a channel 5 present between the source area 3 and the drain area 4, and a control gate electrode 9 disposed on an insulating film 19 and a tunnel insulating film 8 on the floating gate electrode 7. The arrow B in FIG. 1 shows movement of electrons from the floating gate 7 to the control gate electrode 9 in the erasure mode; while the arrow C shows movement of electrons from the channel area 5 to the floating gate electrode 7 in the write mode.

The insulating film 19 is formed with a Local Oxidation on Silicon (LOCOS) process. The floating gate 7 has lips 7b formed to extend upward from the upper edges thereof. The control gate electrode 9 has a first part serving as a selector gate 10 disposed on the channel 5 and the insulating films 6 and 8 and a second part disposed on the floating gate electrode 7 and the insulating films 6 and 8. The selector gate 10, the source area 3 and the drain area 4 comprise a selector transistor 11. Accordingly, the split gate type memory cell 1 has the transistor consisting of the floating gate electrode 7, the control gate electrode 9, the source area 3 and the drain area 4, connected in series with the selector transistor 11.

FIG. 2A is a schematic cross-sectional view showing a part of a memory cell array having a plurality of the split gate type memory cells 1, as disclosed in WO92/18980. The memory cells 1 are arranged in the form of a matrix on the silicon substrate 2. FIG. 2B is a schematic plan view showing a part of the memory cell array. FIG. 2A is a cross section taken along the line 2A—2A in FIG. 2B.

Each pair of adjacent memory cells 1a and 1b share the source area 3. The floating gate electrode 7 and the control gate electrode 9 of one memory cell 1a and those of the other memory cell 1b are arranged symmetrically on each side of the source area 3. Such symmetrical arrangement reduces the area to be occupied by the memory cells on the substrate 2. As shown in FIG. 2B, a field insulating film 13 for separating the memory cells 1 from one another is formed on the substrate 2. Each pair of memory cells 1a, 1b arranged in column also share the control gate electrode 9, with each control gate 9 forming a word line. The drain areas 4 in the pairs of memory cells 1a, 1b arranged in row are connected to a common bit line (not shown) via line contacts 14, respectively.

FIG. 3A is a schematic cross-sectional view showing a part of memory cell array having a plurality of split gate type memory cells disclosed in U.S. Pat. No. 5,029,130. Compared with FIG. 2A, the arrangement of the memory cells, the drain area 4 and the source area 3 are replaced with each other. FIG. 3B is a schematic plan view showing a part of the memory cell array.

A method for manufacturing a memory cell array 150 is described with reference to FIGS. 4A to 4G.

Step 1 (FIG. 4A): The silicon oxide gate insulating film 6 is formed on a device forming area of the substrate 2 according to the thermal oxidation method, and then a doped polysilicon film 31 is formed on the gate insulating film 6. A silicon nitride film 32 is formed over the entire surface of the doped polysilicon film 31 employing the Low Pressure Chemical Vapor Deposition (LPCVD) method. After a resist is applied over the entire surface of the silicon nitride film 32, the resist is partially removed by known photolithographic procedures to form an etching mask 33 for forming the floating gate 7.

Step 2 (FIG. 4B): After the silicon nitride film 32 is etched by means of anisotropic etching employing the etching mask 33, the etching mask 33 is removed. Next, the doped polysilicon film 31 is partly oxidized by means of LOCOS employing the partially etched silicon nitride film 32 as a mask to form the insulating film 19. In this process, the insulating film 19 intrudes into the edge portions of the silicon nitride film 32 to form bird's beaks 19a.

Step 3 (FIG. 4C): After the silicon nitride film 32 is removed, the doped polysilicon film 31 is etched by means of anisotropic etching employing the insulating film 19 as an etching mask. Thus, the doped polysilicon film 31 remaining after etching constitutes the floating gate electrodes 7. In this process, since the insulating film 19 has bird's beaks 19a formed thereon, the sharp lips 7b are formed along the upper edges of the floating gate 7 below the bird's beaks 19a.

Step 4 (FIG. 4D): The silicon oxide tunnel insulating film 8 is formed by thermal oxidation, LPCVD or a combination thereof over the entire surface of the device formed in Step 3.

Step 5 (FIG. 4E): A doped polysilicon film 34 is formed over the entire surface of the device formed in Step 4.

Step 6 (FIG. 4F): After a resist is applied over the entire surface of the device formed by in Step 5, an etching mask 35 is formed by means of photolithography.

Step 7 (FIG. 4G): The doped polysilicon film 34 is etched by anisotropic etching employing the etching mask 35 to form the control gate electrodes 9. Then, the etching mask 35 is removed.

As shown in FIG. 5, at the initial stage of forming the tunnel insulating film 8 in Step 4, an incomplete silicon oxide film 8a attributed to native oxide film, structural transition layer, etc. is formed. This incomplete silicon oxide film 8a contains not only silicon oxide having the complete O—Si—O bond but also dangling bonds not having the O—Si—O bond. While the process proceeds from Step 3 to Step 4, since lateral faces of the floating gate electrode 7 are exposed to the outside air, a native oxide film is formed on the surface of the lateral faces. The native oxide film contains dangling bonds not having the O—Si—O bond. Further, the structural transition layer is present at the border between the floating gate electrode 7 and the silicon oxide tunnel insulating film 8. In the structural transition layer, dangling bonds not having the O—Si—O bond are likely to exist.

FIG. 6 is a schematic cross-sectional view showing the memory cell 1 having an incomplete silicon oxide film 8a. The data stored in the memory cell 1 is erased when electrons in the floating gate electrode 7 flow to the control gate electrode 9 side as indicated by the arrow B. In this process, when the electrons accelerated by a high electric field pass through the tunnel insulating film 8 having such incomplete silicon oxide film 8a, the films 8, 8a undergo great stress. Accordingly, stress is repeatedly applied to the films 8, 8 by repeating a write operation and an erase operation to form and accumulate electron traps in the incomplete silicon oxide film 8a. In other words, an increase in the number of repeating write and erase operations (i.e. the number of data rewritings) increases electron traps. The thus formed electron traps inhibit migration of electrons from the floating gate electrode 7 to the control gate electrode 9. As a result, it becomes difficult to sufficiently withdraw the electrons in the floating gate electrode 7.

As described above, electron traps induce a phenomenon which is shown in FIG. 7. More specifically, in the read mode, although the electric current flowing into the memory cell (assuming the written state) is maintained at a constant level as shown, the current flowing into the memory cell 1 (assuming the erased state) attenuates, so that the difference between the electric current flowing into the memory cell 1 in the written state and the electric current flowing into the memory cell in the erased state becomes small as the number of data rewrites increases. This makes it difficult for a sense amplifier to read the data stored in the cell by detecting the level of the cell current. Thus, as it is difficult to read the data from the memory cell, the intended function of the memory cell cannot be expected. As described above, the incomplete silicon oxide film 8a makes it difficult to increase the number of data rewrites and also to reduce the operating life of the flash EEPROM.

Further, as shown in FIG. 8, in Step 4, when the tunnel insulating film 8 is formed according to the thermal oxidation method, the edges of the tunnel insulating film 8 intrude under the lower edges of the floating gate electrode 7 to form bird's beaks (gate bird's beaks) 8b. The bird's beaks 8b cause recession of the tunnel insulating film 8 on the opposite surface from the bird's beaks 8b to form gaps 8c. As shown in FIG. 9, in Step 5, the doped polysilicon film 34 intrudes into the gaps 8c to form sharp fins 9a corresponding to the profile of the gaps 8c along the lower edges of the control gate electrode 9.

The control gate electrode 9 permits, in the write mode, release of electrons from the fins 9a to induce a phenomenon called reverse tunneling such that electrons are injected from the control gate 9 into the floating gate 7. This reverse tunneling causes a problem in that data is written in memory cells 1 which were not selected for writing in the write mode. Consequently, it becomes impossible to write independent data in the respective memory cells 1, and the EEPROM cannot perform its intended function. As described above, the bird's beaks 8b cause reverse tunneling to make the flash EEPROM difficult to exhibit its function.

SUMMARY OF THE INVENTION

Broadly speaking, the present invention relates to a split gate type transistor which can increase the number of data rewrites and also to a method for manufacturing the same. The present invention can be implemented in numerous ways, including as an apparatus and method.

A first embodiment of the invention pertains to a method for manufacturing a split gate type transistor. The method includes the steps of: forming a semiconductor substrate; forming a floating gate electrode over the semiconductor substrate, the floating gate electrode having at least one lateral face portion; and nitrating the at least one lateral face portion to form a nitrogen-containing layer. The nitration of the at least one lateral face portion may be achieved employing a method selected from the group consisting of nitrogen ion implantation, nitrogen plasma exposure and thermal treatment in an atmosphere containing nitrogen. The floating gate electrode may have a plurality of lateral face portions. The nitration of the plurality of lateral face portions may be achieved employing a nitrogen ion rotational oblique implantation.

The second embodiment of the invention also pertains to a method for manufacturing a split gate type transistor. The method includes the steps of: forming a semiconductor substrate; forming a floating gate electrode over the semiconductor substrate, the floating gate electrode having at least one lateral face; forming a tunnel insulating film on the semiconductor substrate to cover at least the floating gate electrode; and nitrating the tunnel insulating film. The nitration of the tunnel insulating film may be achieved employing a method selected from the group consisting of nitrogen ion implantation, nitrogen plasma exposure and thermal treatment in an atmosphere containing nitrogen. The nitrogen atoms contained in the tunnel insulating film by nitration thereof are preferably distributed such that the maximum nitrogen concentration is achieved at least near one of the at least one lateral face portion and on an opposing side of the at least one lateral face portion.

The third embodiment of the invention pertains to a split gate type transistor. The transistor includes a semiconductor substrate; a floating gate electrode disposed over the semiconductor substrate, and the floating gate electrode having at least one lateral face portion. The at least one lateral face portion includes a nitrogen-containing layer. The transistor further includes a tunnel insulating film disposed over the semiconductor substrate, covering at least the floating gate electrode; and a control gate electrode having a first part disposed over the semiconductor substrate, and a second part covering the at least one lateral face portion via the tunnel insulating film. The floating gate electrode is formed from a conductive film containing at least one silicon selected from the group consisting of an amorphous silicon, a polysilicon and a single crystal silicon. The tunnel insulating film contains at least one selected from the group consisting of silicon oxide, silicon oxynitride and silicon nitride.

A fourth embodiment of the invention pertains to a split gate type transistor. The transistor includes a semiconductor substrate; a floating gate electrode disposed over the semiconductor substrate; and a tunnel insulating film disposed over the semiconductor substrate, covering at least the floating gate electrode. The tunnel insulating film contains nitrogen atoms. The nitrogen atoms contained in the tunnel insulating film are preferably distributed such that the maximum nitrogen concentration is achieved near the floating gate electrode. The transistor further includes a control gate electrode having a first part disposed over the semiconductor substrate, and a second part covering a portion of the floating gate electrode via the tunnel insulating film. The nitrogen atoms contained in the tunnel insulating film are preferably distributed such that the maximum nitrogen concentration is achieved near the control gate electrode. The nitrogen atoms contained in the tunnel insulating film are preferably widely distributed along a width of the tunnel insulating film.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2A is a schematic cross-sectional view showing a part of a memory cell array having a plurality of the prior art split gate type memory cells; while FIG. 2B is a schematic plan view showing a part of the memory cell array of FIG. 2A;

FIG. 3A is a schematic cross-sectional view showing a part of a memory cell array having a plurality of another prior art split gate type memory cells; while FIG. 3B is a schematic plan view showing a part of the memory cell array of FIG. 3A;

FIG. 8 is a schematic cross-sectional view illustrating bird's beaks which can occur along the lower edges of the floating gate electrode in the step of forming the tunnel insulating film;

FIG. 9 is a schematic cross-sectional view showing a memory cell having fins formed on the control gate;

FIG. 11A is a schematic cross-sectional view showing a part of a memory cell array having a plurality of split gate type memory cells according to the first embodiment; while

FIG. 13A is a schematic cross-sectional view showing a part of a memory cell array having a plurality of split gate type memory cells according to a second embodiment of the present invention; while FIG. 13B is a schematic plan view showing a part of the memory cell array of FIG. 13A;

FIG. 18 is a table illustrating the voltage for individual operation modes of the flash EEPROM of FIG. 17;

FIG. 19A is a schematic cross-sectional view of a part of memory cell array having a plurality of split gate type memory cells according to the first embodiment, in which the source area and the drain area are switched with each other;

FIG. 19B is a schematic plan view of the memory cell array of FIG. 19A;

FIG. 20A is a schematic cross-sectional view of a part of memory cell array having a plurality of split gate type memory cells according to the second embodiment;

FIG. 20B is a schematic plan view of the memory cell array of FIG. 20A;

FIG. 22 is a table illustrating the voltage for individual operation modes of the flash EEPROM of FIG. 21.

DETAILED DESCRIPTION OF THE PREFERRED EMBODIMENTS

Figure 1:
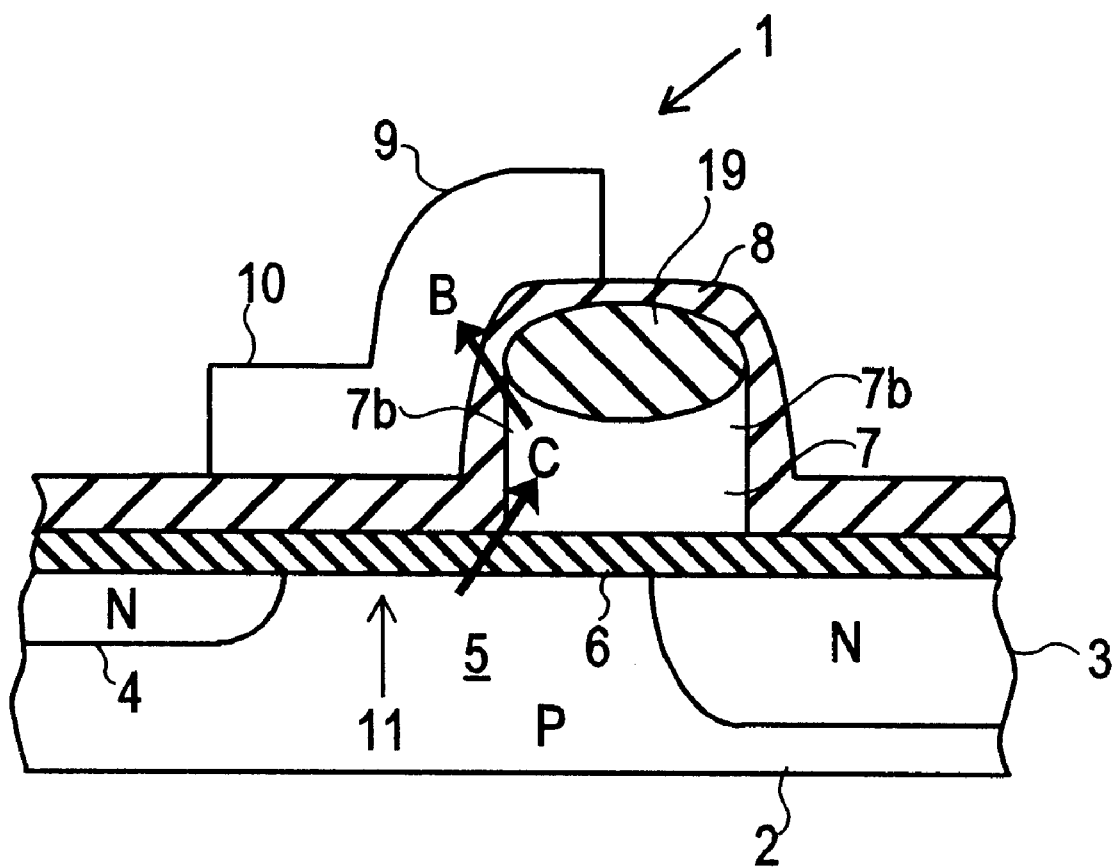
FIG. 1 is a schematic cross-sectional view showing an example of a prior art split gate type memory cell.
Figure 4A:
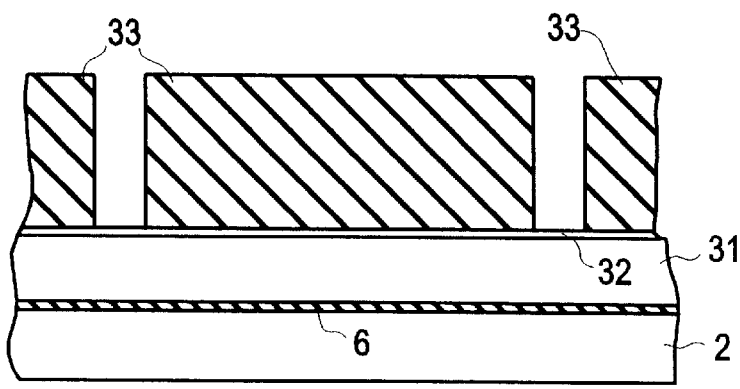
FIGS. 4A to 4G are schematic cross-sectional views showing a process for manufacturing a prior art memory cell array.
Figure 4B:
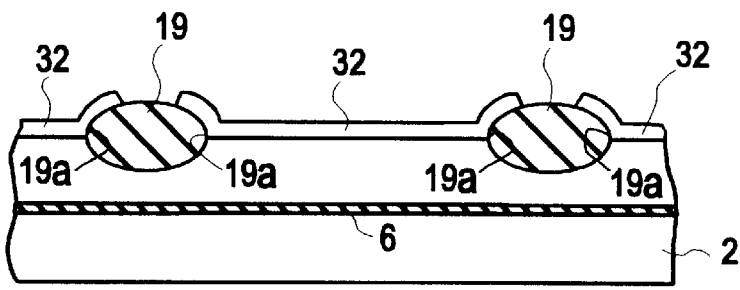
Figure 4C:
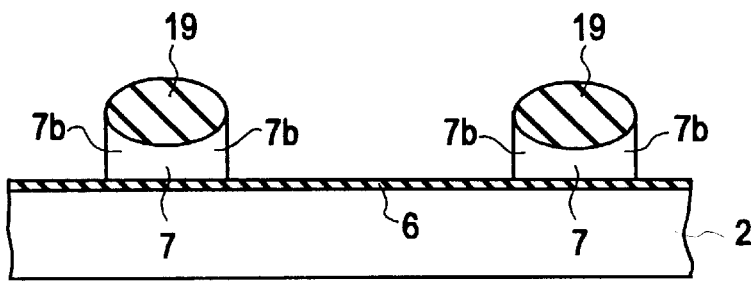
Figure 4D:
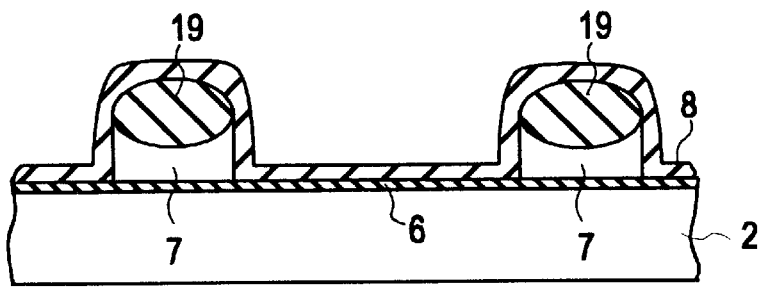
Figure 4E:
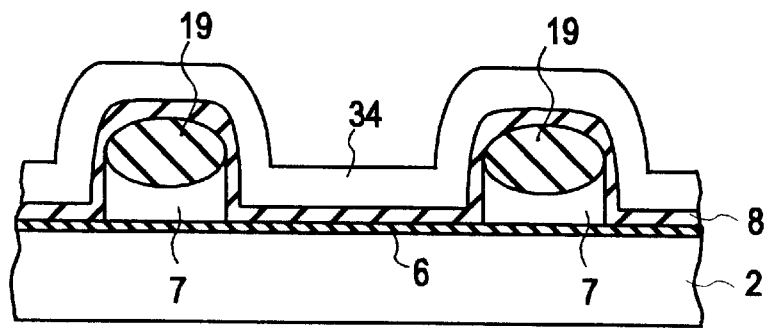
Figure 4F:
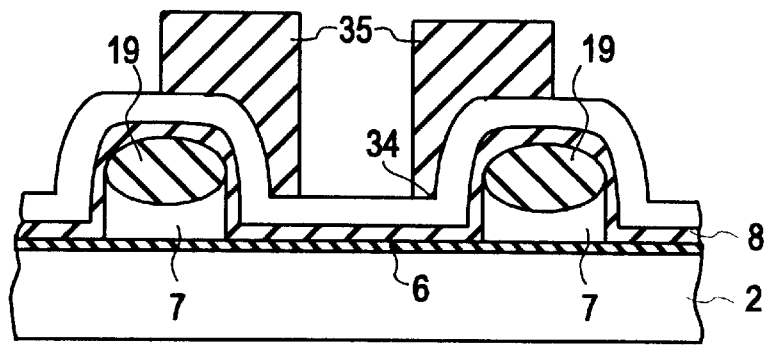
Figure 4G:
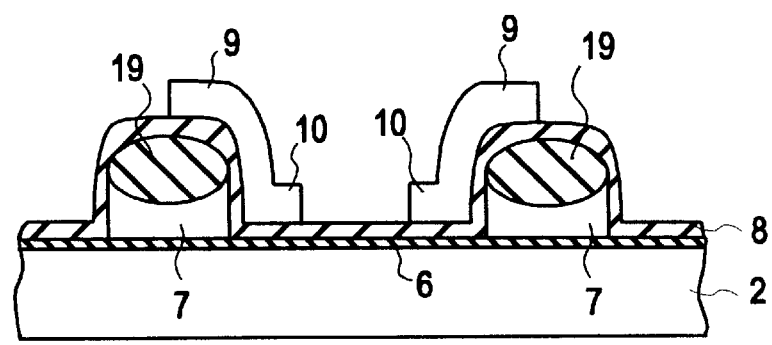
Figure 5:
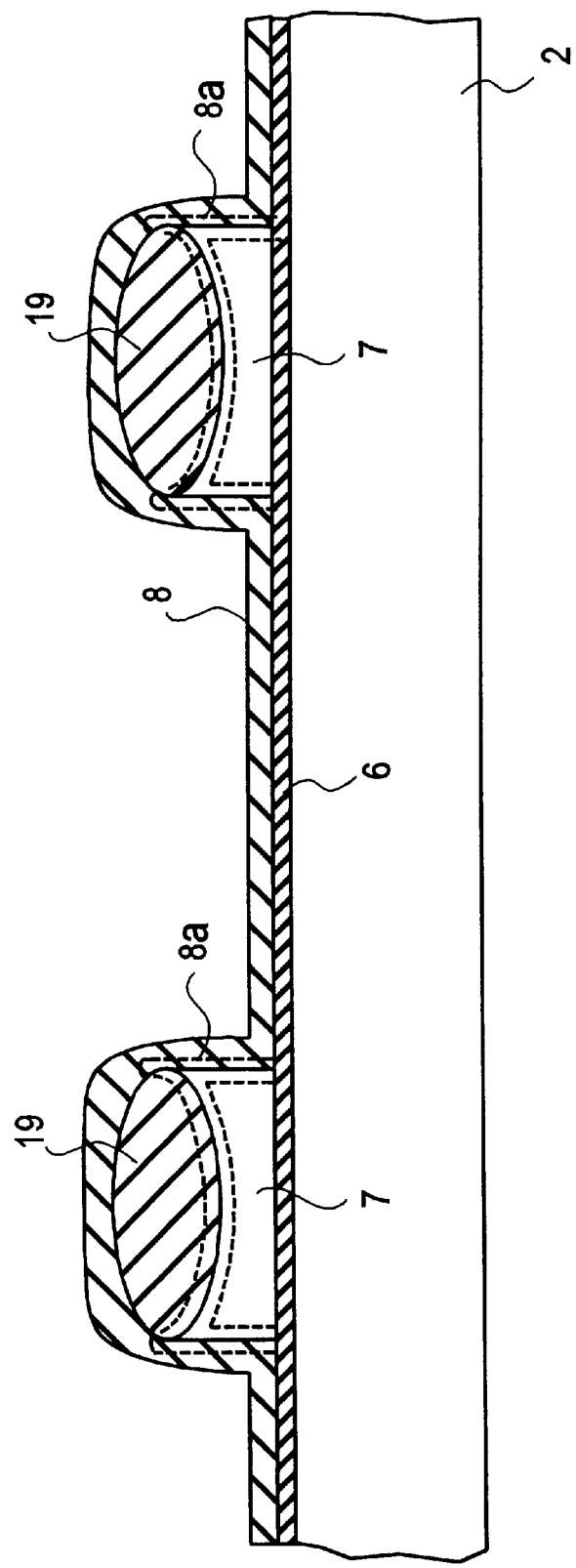
FIG. 5 is a schematic cross-sectional view illustrating an incomplete silicon oxide film which can occur in the step of forming the tunnel insulating film.
Figure 6:
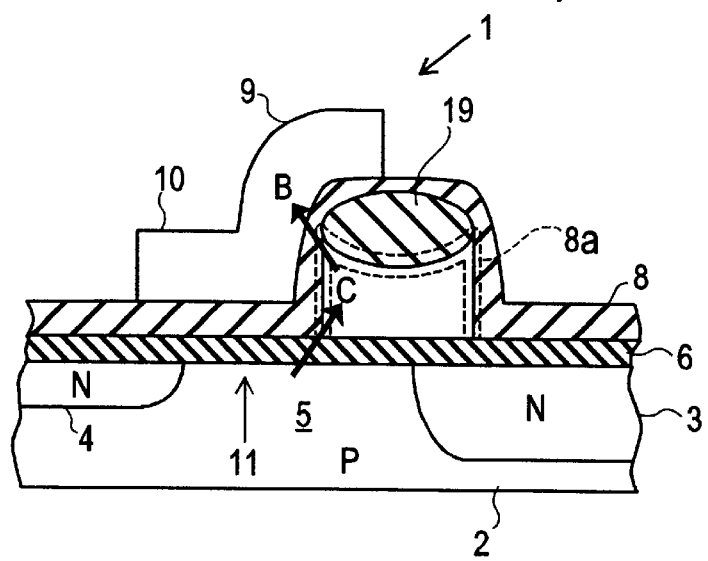
FIG. 6 is a schematic cross-sectional view showing a memory cell having an incomplete silicon oxide film.
Figure 7:
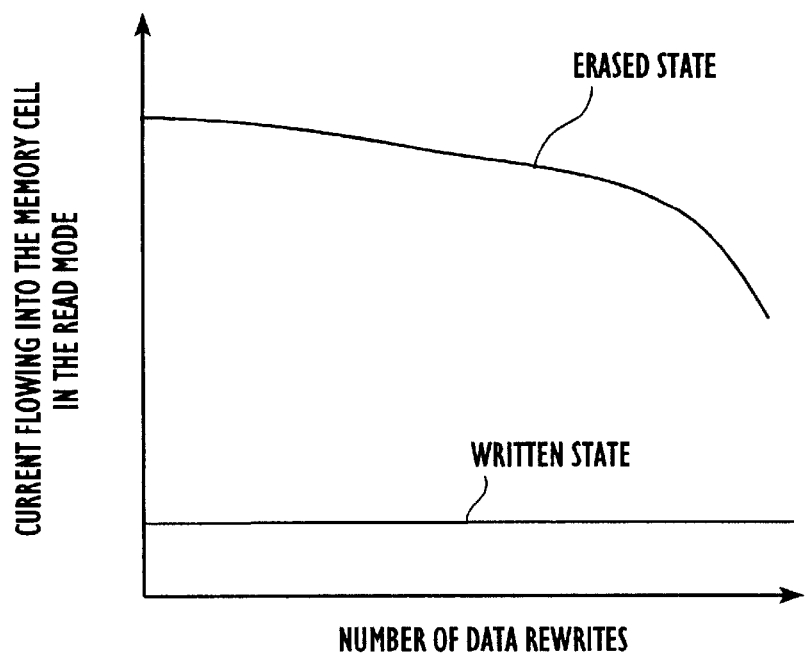
FIG. 7 is a graph showing a relationship between the number of data rewrites in the memory cell and the current flowing into the memory cell in the read mode.
Figure 10:
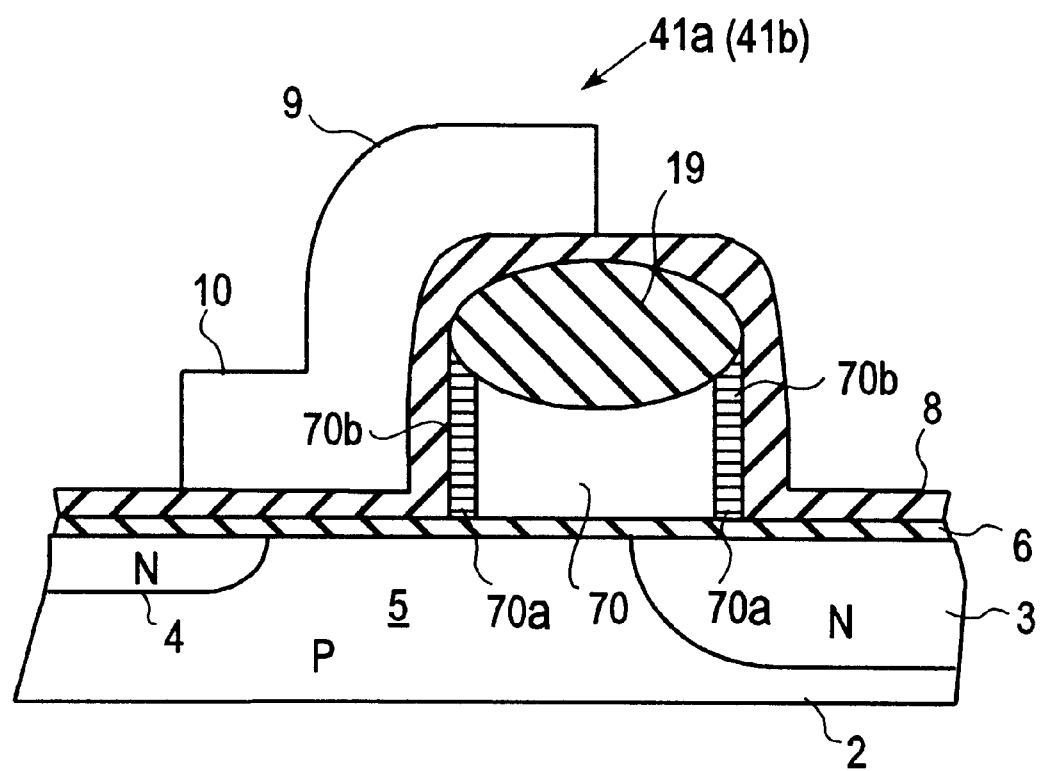
FIG. 10 is a schematic cross-sectional view showing a split gate type memory cell according to a first embodiment of the present invention.
Figure 11A:
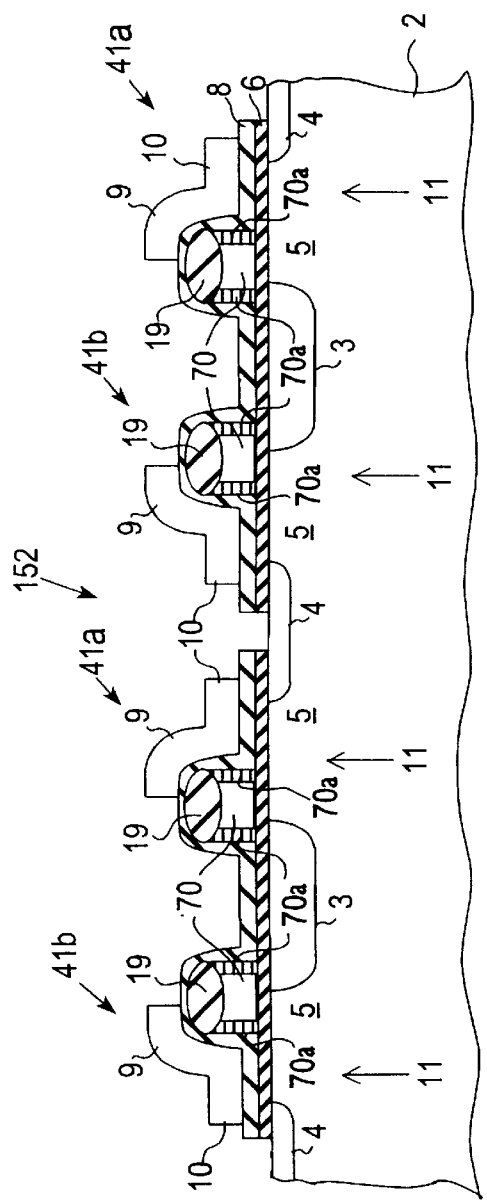
Figure 11B:
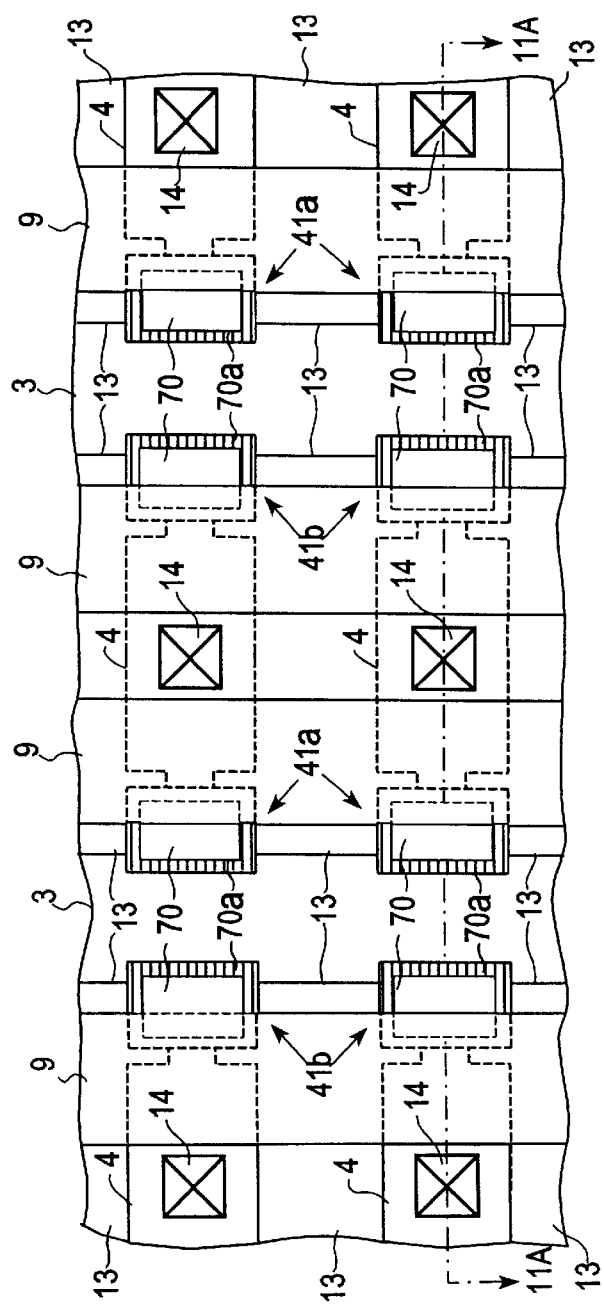
FIG. 11B is a schematic plan view showing a part of the memory cell array of FIG. 11A.
Figure 12A:
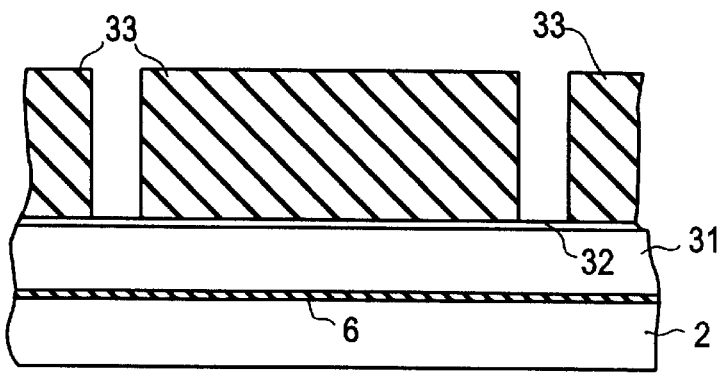
FIGS. 12A to 12J are schematic cross-sectional views showing a process for manufacturing the memory cell array according to the first embodiment.
Figure 12B:
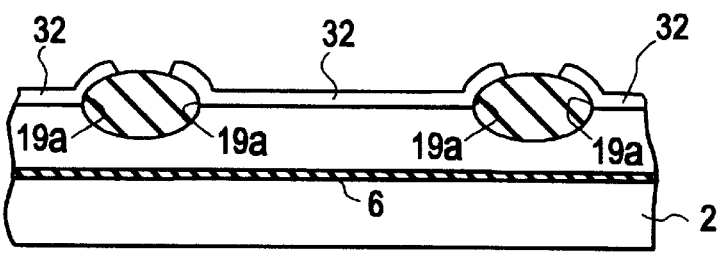
Figure 12C:
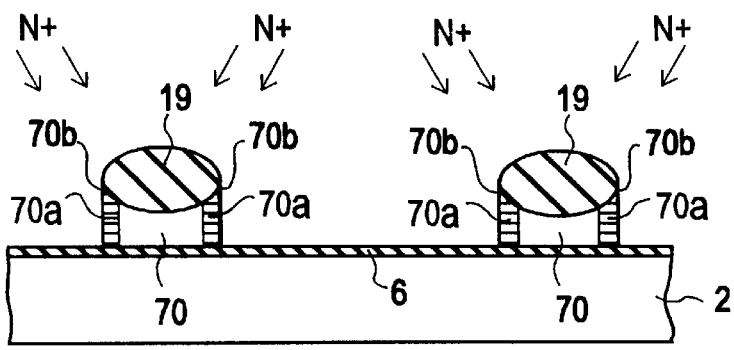
Figure 12D:
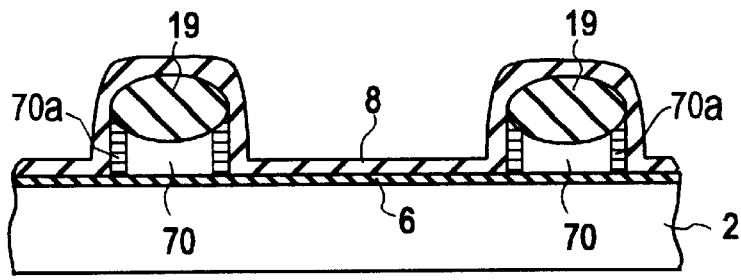
Figure 12E:
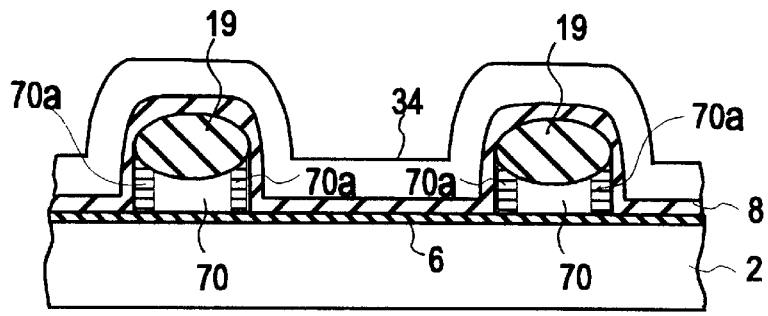
Figure 12F:
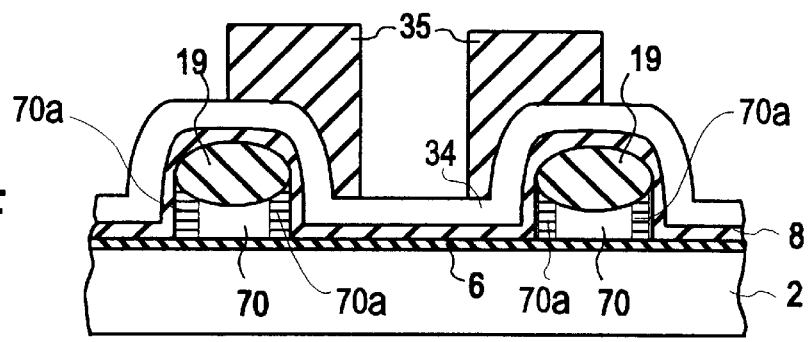
Figure 12G:
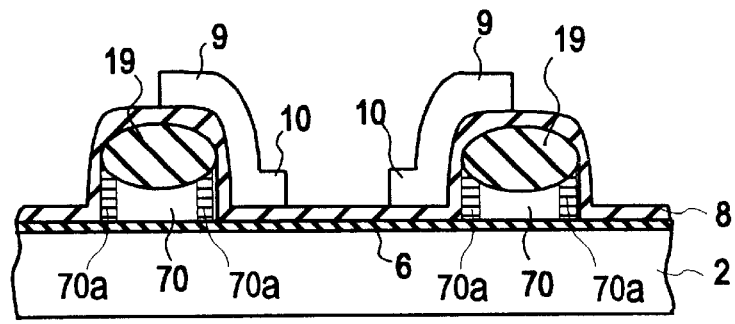
Figure 12H:
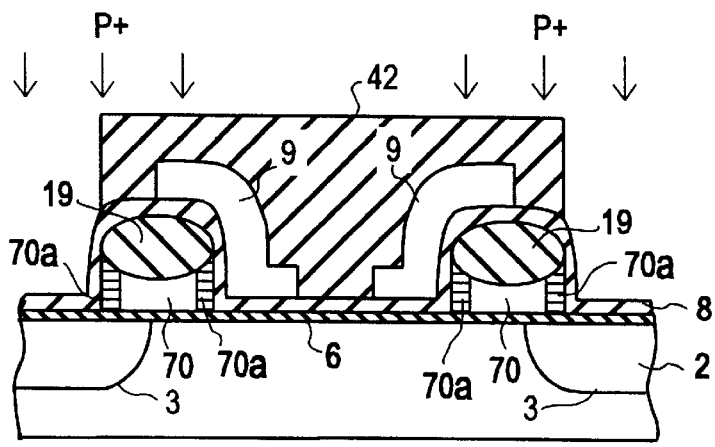
Figure 12I:
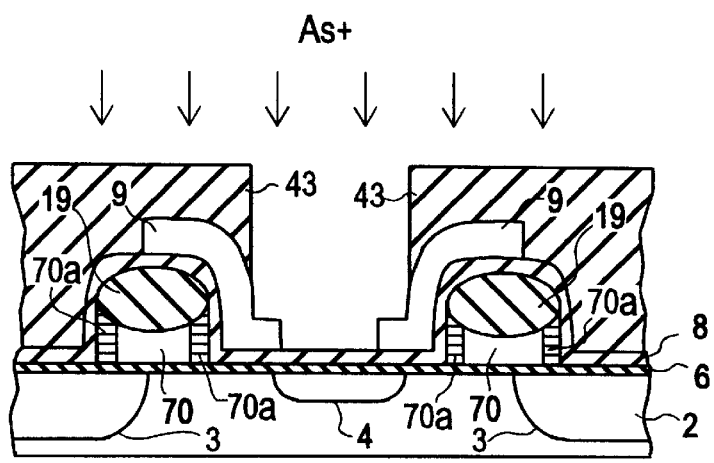
Figure 12J:
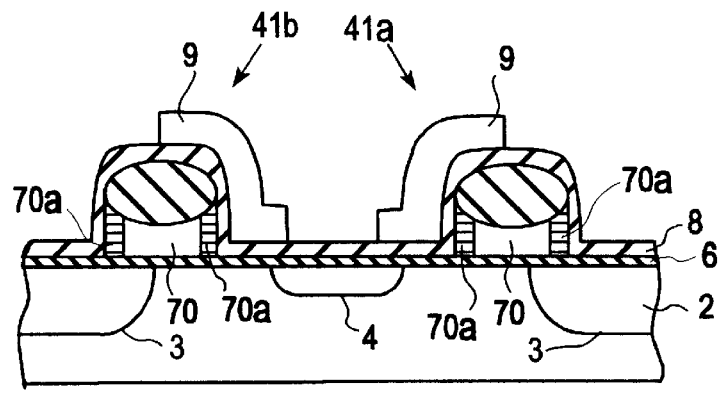

A split gate type memory cell 41a, 41b according to a first embodiment of the present invention and a flash EEPROM 151 employing the same will be described referring to the drawings where the same elements are designated with the same reference numbers throughout. FIG. 10 is a schematic cross-sectional view showing a split gate type memory cell 41a, 41b according to the first embodiment. FIG. 11A is a schematic cross-sectional view showing a part of a memory cell array 152 having a plurality of the split gate type memory cells 41a, 41b according to the first embodiment; while FIG. 11B is a schematic plan view showing a part of the memory cell array 152. FIG. 11A is a cross section taken along the line 11A—11A in FIG. 11B.

Each split gate type memory cell (split gate type transistor) 41a (41b) is provided with an N-type conductive source area 3 and an N-type conductive drain area 4 which are disposed on a P-type conductive single crystal silicon substrate 2, a floating gate electrode 70 disposed on an insulating film 6 over a channel 5 between the source area 3 and the drain area 4, and a control gate 9 disposed on an insulating film 19 over the floating gate electrode 70 and a tunnel insulating film 8. The P-type single crystal silicon substrate 2 may be replaced with a P-type well, an N-type single crystal silicon substrate or an N-type well. The N-type doped area may be termed a first conductivity type area with respect to the P-type doped area. Similarly, the P-type doped area may be termed a second conductivity type area with respect to the N-type doped area. The first and second conductivity types are formed from the class of dopants forming N and P-type dopants, respectively.

The insulating film 19 is formed according to the LOCOS process. The floating gate electrode 70 is preferably formed to have a generally rectangular shape having an upper face, a lower face and four lateral faces, with the upper face having sharp lips 70b formed to extend upward from the edges thereof. The floating gate electrode 70 further has on each lateral face a doped polysilicon film layer 70a containing about 1 to about 10% of nitrogen atoms (hereinafter referred to as a nitrogen-containing layer).

The control gate electrode 9 has a first part serving as a selector gate 10 disposed via the insulating films 6 and 8 on the channel 5 and a second part disposed via the insulating films 6 and 8 on the floating gate electrode 70. The selector gate 10, the source area 3 and the drain area 4 comprise a selector transistor 11. Accordingly, the split gate type memory cell 41a, 41b has the transistor comprising the floating gate electrode 70, the control gate electrode 9, the source area 3 and the drain area 4, as well as, the selector transistor 11 connected serially to the former transistor. The floating gate electrode 70 and the control gate electrode 9 are made of doped polysilicon. The floating gate electrode 70 and the control gate electrode 9 may be formed employing amorphous silicon, single crystal silicon, various metals including high-melting point metals or a conductive material such as silicide in place of the doped polysilicon.

As shown in FIG. 11A, each pair of adjacent memory cells 41a and 41b share the source area 3 so as to reduce the area occupied by the memory cells 41a, 41b on the substrate 2, with the floating gate electrode 70 and the control gate electrode 9 of one memory cell 41a and those of the other memory cell 41b are arranged symmetrically on each side of the source area 3.

Next, a method for manufacturing the memory cell array according to the first embodiment will be described referring to FIGS. 12A to 12J.

Step 1 (FIG. 12A): The field insulating film 13 (not shown) is formed on the substrate 2 preferably according to the LOCOS process except for the area where a device is to be formed. The silicon oxide gate insulating film 6 is formed on the device-forming area of the substrate 2 preferably according to the thermal oxidation method. Subsequently, a doped polysilicon film 31 is formed on the gate insulating film 6. The silicon nitride film 32 is formed over the entire surface of the doped polysilicon film 31, preferably according to the LPCVD process. Next, a resist is applied over substantially the entire surface of the silicon nitride film 32. The silicon nitride film 32 is then partly removed using known photolithographic procedures to form the etching mask 33 for forming the floating gate electrode 70.

Step 2 (FIG. 12B): After the silicon nitride film 32 is etched for by means of anisotropic etching employing the etching mask 33, the etching mask 33 is removed in a conventional manner. Next, the doped polysilicon film 31 is partly oxidized by means of LOCOS employing the partially etched silicon nitride film 32 as a mask to form an insulating film 19. In this process, the insulating film 19 intrudes into the edge portions of the silicon nitride film 32 to form bird's beaks 19a. As will be understood by those of ordinary skill in the art this substep of forming the insulating film 19 may be omitted as necessary.

Step 3 (FIG. 12C): After the silicon nitride film 32 is removed, the doped polysilicon film 31 is etched by means of anisotropic etching employing the insulating film 19 as an etching mask. Thus, the doped polysilicon film 31 remained after etching constitutes floating gate electrodes 70. In this process, since the insulating film 19 has bird's beaks 19a formed thereon, sharp lips 70b are formed along the upper edges of the floating gate electrode 70 locating below the bird's beaks 19a.

Step 4: The lateral faces of the floating gate electrode 70 are subjected to nitrogen ion implantation over the entire surface to form a nitrogen-containing layer 70a. In this process, an implantation method called rotational oblique ion implantation is preferably employed so as to achieve uniform nitrogen implantation into the four lateral faces of the floating gate electrode 70. According to this method, nitrogen ion is implanted at an angle of about 60° with respect to a normal line (not shown) extending perpendicular to the surface of the substrate 2, while a silicon wafer (not shown) having the substrate 2 formed thereon is rotated. This rotational oblique ion implantation permits high-accuracy control of the amount of nitrogen ion to be implanted and facilitates formation of the nitrogen-containing layer 70a.

Conditions of nitrogen ion implantation are as follows:

Implantation energy: ca. 10 keV

Dose: $1 \times 10^{15} - 5 \times 10^{16}$ atoms/cm$^2$

Implantation energy: The projection range (RP) of nitrogen ion having an energy of 10 keV in the polysilicon film is about 0.02 $\mu$m.

In this case, since the nitrogen ions implanted to the floating gate electrode 70 are introduced only to the portion very close to the surface of the lateral faces of the floating gate electrode 70, the nitrogen-containing layer 70a has a relatively small thickness. A dose of more than the range of $1 \times 10^{15} - 5 \times 10^{16}$ atoms/cm$^2$ permits formation of silicon nitride on the lateral faces of the floating gate electrode 70. It is possible to inhibit formation of the tunnel insulating film 8 by the silicon nitride. A dose of less than the range of $1 \times 10^{15} - 5 \times 10^{16}$ atoms/cm$^2$ makes it difficult to give merits to be described later.

Step 5 (FIG. 12D): A silicon oxide tunnel insulating film 8 is formed by means of thermal oxidation, LPCVD or a combination of them over the entire surface of the device having undergone in Step 4. Thus, the laminated gate insulating film 6 and the tunnel insulating film 8 are integrated into one body. The gate insulating film 6 and the tunnel insulating film 8 may be of a film formed using as a major component at least one silicon preferably selected from silicon oxide, silicon oxynitride and silicon nitride. Such insulating film is formed preferably employing at least one method selected from thermal oxidation, thermal nitration, thermal oxynitration and CVD. The insulating films 6 and 8 may be formed by laminating a plurality of insulating film layers of different materials as will be understood by those of ordinary skill in the art.

Since the floating gate electrode 70 has a nitrogen-containing layer 70a formed on all lateral faces, it has no incomplete silicon oxide film attributed to native oxide film or structure transition layer at the initial stage of forming the tunnel insulating film 8.

While the process proceeds from Step 4 to Step 5, the lateral faces of the floating gate electrode 70 may be exposed to the outside air containing oxygen. However, since the nitrogen-containing layer 70a is formed on them, it is possible to control the forming of a native oxide film, which contains dangling bonds and does not have the O—Si—O bond on the surface of lateral faces of the floating gate electrode 70.

Further, a structural transition layer where dangling bonds are likely to be formed is present at the border between the polysilicon film floating gate electrode 70 and the silicon oxide tunnel insulating film 8. However, the dangling bonds are terminated the trivalent nitrogen atoms contained in the nitrogen-containing layer 70a. Accordingly, occurrence of dangling bond in the structural transition layer can be minimized.

The nitrogen-containing layer 70a prevents, when the tunnel insulating film 8 is formed employing the thermal oxidation method, the edges of the insulating film 8 from intruding into the lower edge portions of the floating gate electrode 70. Thus, no bird's beak (gate bird's beak) is formed on the tunnel insulating film 8.

Step 6 (FIG. 12E): A doped polysilicon film 34 is formed over the entire surface of the device of Step 5. The doped polysilicon films 31, 34 can be formed according to the following methods:

Method 1: A polysilicon film is formed by means of LPCVD in an atmosphere of impurity-containing gas.

Method 2: An undoped polysilicon film is formed by means of LPCVD, and then an impurity diffusion source layer is formed on the polysilicon film by using $POCl_3$ or the like. The impurity is diffused from the impurity diffusion source layer into the polysilicon film to form a doped polysilicon film.

Method 3: An undoped polysilicon film is formed by means of LPCVD, followed by impurity ion implantation.

Step 7 (FIG. 12F): After a resist is applied over the entire surface of the device underwent Step 5, an etching mask 35 is formed by means of photolithography.

Step 8 (FIG. 12G): The doped polysilicon film 34 is etched by anisotropic etching employing the etching mask 35 to form the control gate electrode 9. Then, the etching mask 35 is removed in a conventional manner.

Step 9 (FIG. 12H): After a resist is applied over the entire surface of the device of Step 8, a mask 42 for defining the source area 3 is formed by means of photolithography. The mask 42 is formed on the substrate 2 preferably such that at least the area on which the drain area 4 is to be defined is covered and that the edges of the mask 42 may be substantially aligned with the edge of the floating gate electrode 70. Next, phosphorus ion ($P^+$) is implanted to the surface of the device by means of the known ion implantation method to define a source area 3. In this process, the location of the source area 3 is defined by the edges of the floating gate electrode 70. Then, the mask 42 is removed. The impurity ion to be implanted so as to define the source area 3 is not limited to phosphorus ion, but other N-type impurity ions, such as of arsenic and antimony may be employed.

Step 10 (FIG. 12I): After a resist is applied over the entire surface of the device of Step 9, a mask 43 for defining the drain area 4 is formed by means of photolithography. The mask 43 is preferably formed such that at least the source area 3 may be covered. Next, arsenic ion ($As^+$) is implanted to the surface of the device by means of the known ion implantation method to define the drain area 4. The impurity ion implanted to define the drain area 4 is not limited to arsenic ion, but other N-type impurity ion such as of phosphorus and antimony may be employed. In the case where an N-type single crystal silicon substrate or an N-type well is employed, a P-type impurity ion such as of boron and indium is preferably implanted so as to define the source area 3 and the drain area 4.

Step 11 (FIG. 12J): The mask 43 is then removed, and split gate type memory cells 41a, 41b according to the first embodiment are completed.

As described above, according to the first embodiment, the lateral faces of the floating gate electrode 70 all have a nitrogen-containing layer 70a. Accordingly, at the initial stage of forming the tunnel insulating film 8 in Step 5, formation of incomplete silicon oxide film does not occur. This prevents electron traps from being formed in the tunnel insulating film 8 even when stress is repeatedly applied thereto by repeating writing and erasing operations in the memory cells 41. Therefore, in the erasure mode, it is possible to withdraw electrons in the floating gate electrode 70 sufficiently to enable an increase in the number of data rewrites. As a result, memory cells having elongated operational lives, i.e., a flash EEPROM, can be obtained.

Further, if the number of data rewrites is increased, there occurs no drop in the electric current flowing into the memory cells assuming the erased state. This permits a sense amplifier to perform secured determination of the data value based on the difference between the cell current of the memory cells assuming the written state and those of the erased state.

The nitrogen-containing layer 70a further prevents bird's beaks from being formed at the lower edge portions of the floating gate electrode 70. This avoids formation of the fins 9a, attributed to the bird's beaks, along the lower edges of the control gate electrode 9, so that no reverse tunneling phenomenon occurs. Accordingly, in the write mode, data are not erroneously written in unselected memory cells, but the data can be written in the desired memory cells only.

In the first embodiment, the nitrogen-containing layer 70a may be formed only on a lateral face through which electrons are emitted in the erasure mode. In this case, the nitrogen-containing layer 70a is formed employing the ordinary oblique ion implantation method in place of the rotational oblique ion implantation method.

The nitrogen-containing layer 70a may be formed according to the following methods: (a) The lateral faces of the floating gate electrode 70 are exposed to nitrogen plasma; or (b) After formation of the floating gate electrode 70, it is subjected to thermal treatment in an atmosphere containing nitrogen ($NH_3$ or the like).

A second embodiment of the present invention is now described. To avoid a redundant description, like or same reference numerals are given to those components which are the same as the corresponding components of the first embodiment.

FIG. 13A is a schematic cross-sectional view showing a part of a memory cell array 252 having a plurality of split gate type memory cells 61a, 61b according to the second embodiment. FIG. 13B is a schematic plan view showing a part of that memory cell array 252. FIG. 13A is a cross section taken along the line 13A—13A in FIG. 13B.

As shown in FIGS. 13A and 13B, a plurality of split gate type memory cells (split gate type transistors) 61a, 61b are arranged on a substrate 2. The memory cells 61a, 61b each contain a source area 3, a drain area 4, a channel area 5, a floating gate electrode 70' and a control gate electrode 9.

Each pair of adjacent memory cells 61a and 61b share a common source area 3 so as to reduce the area occupied by the memory cells 61*a*, 61*b* on the substrate 2. The floating gate electrode 70' and the control gate electrode 9 of one memory cell 61*a* and those of the other memory cell 61*b* are arranged symmetrically on each side of the source area 3.

Figure 14:
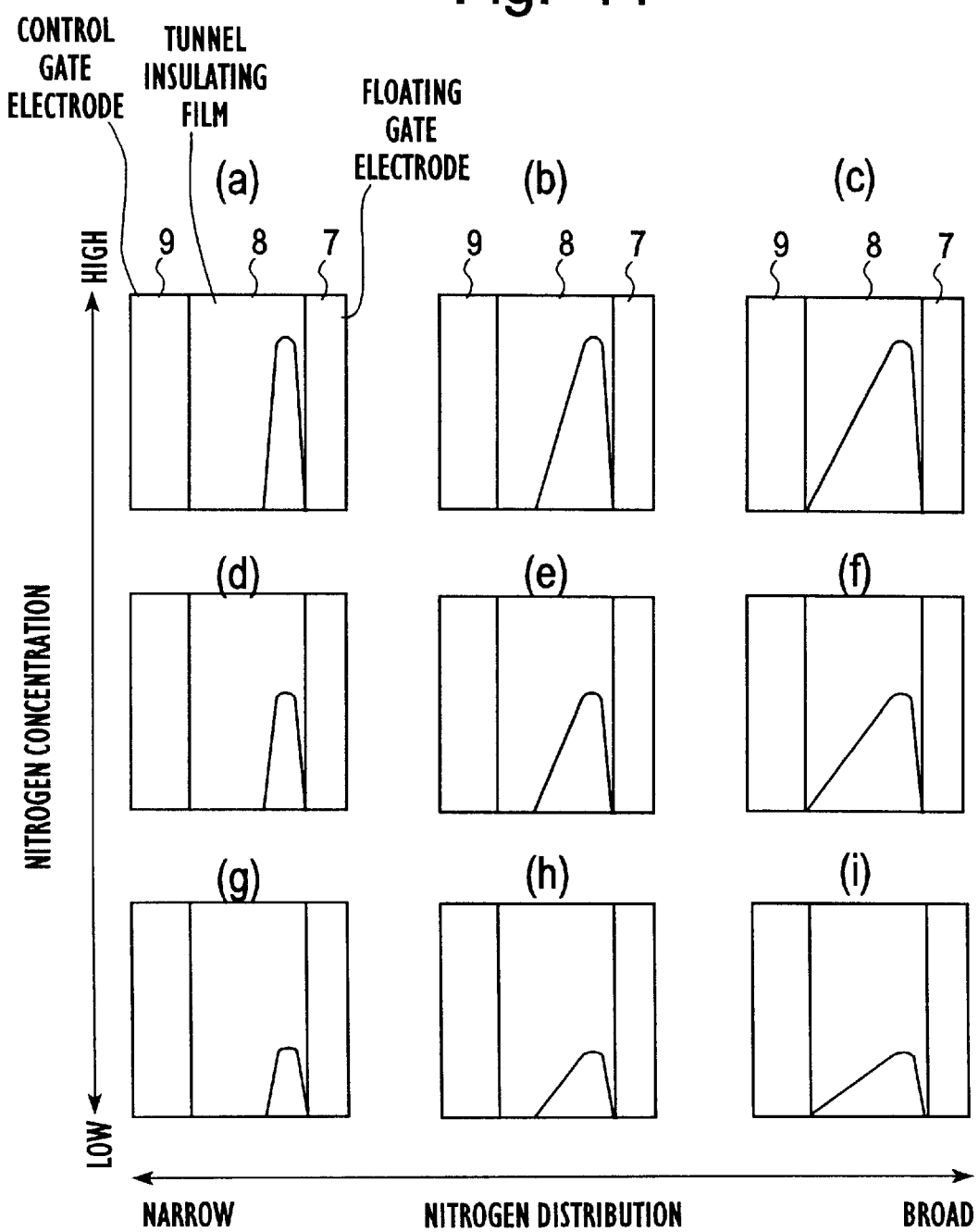
FIG. 14 shows a relationship between the nitrogen concentration and nitrogen distribution in the tunnel insulating film according to a first example.
Figure 15:
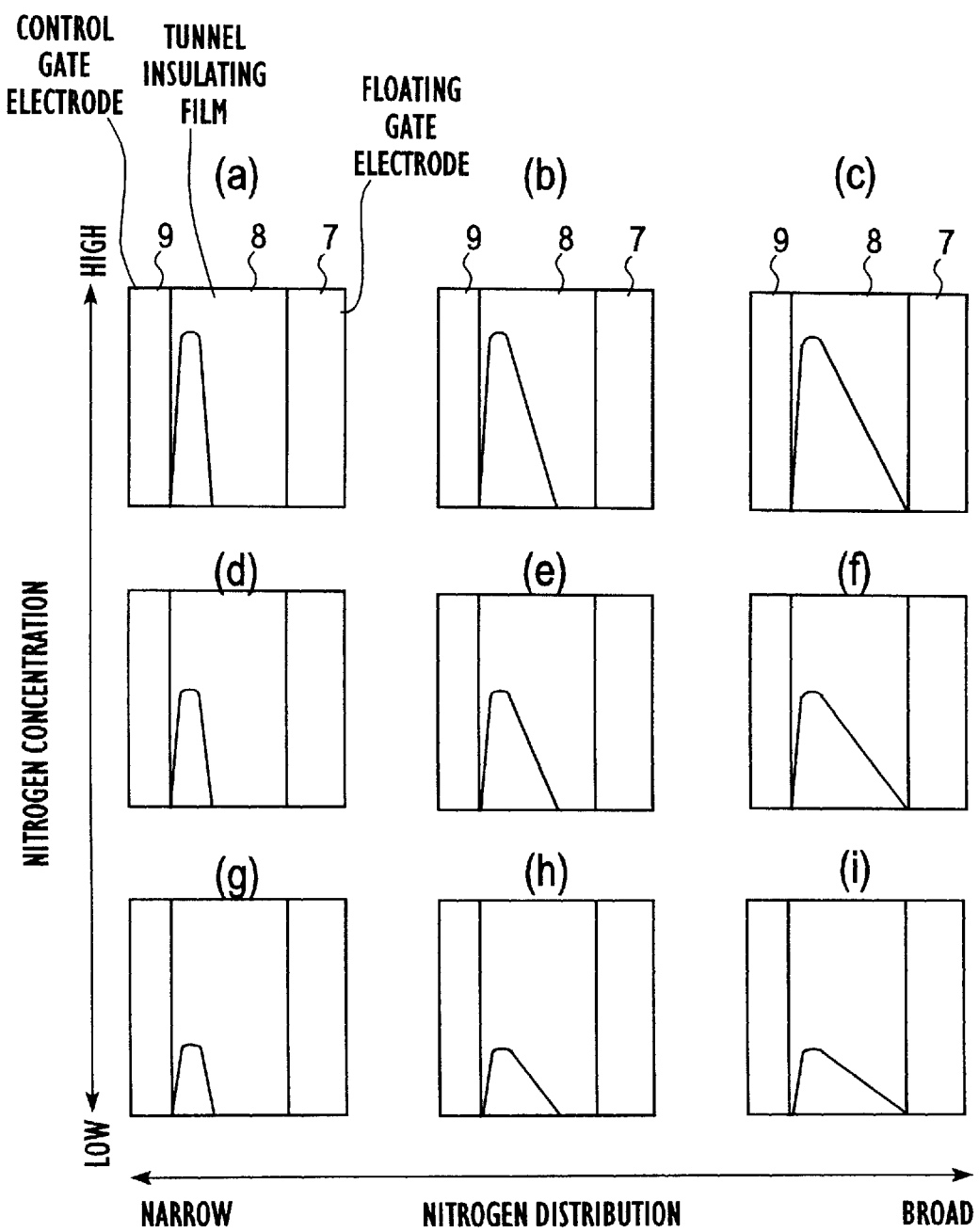
FIG. 15 shows relationship between the nitrogen concentration and nitrogen distribution in the tunnel insulating film according to a second example.
Figure 16:
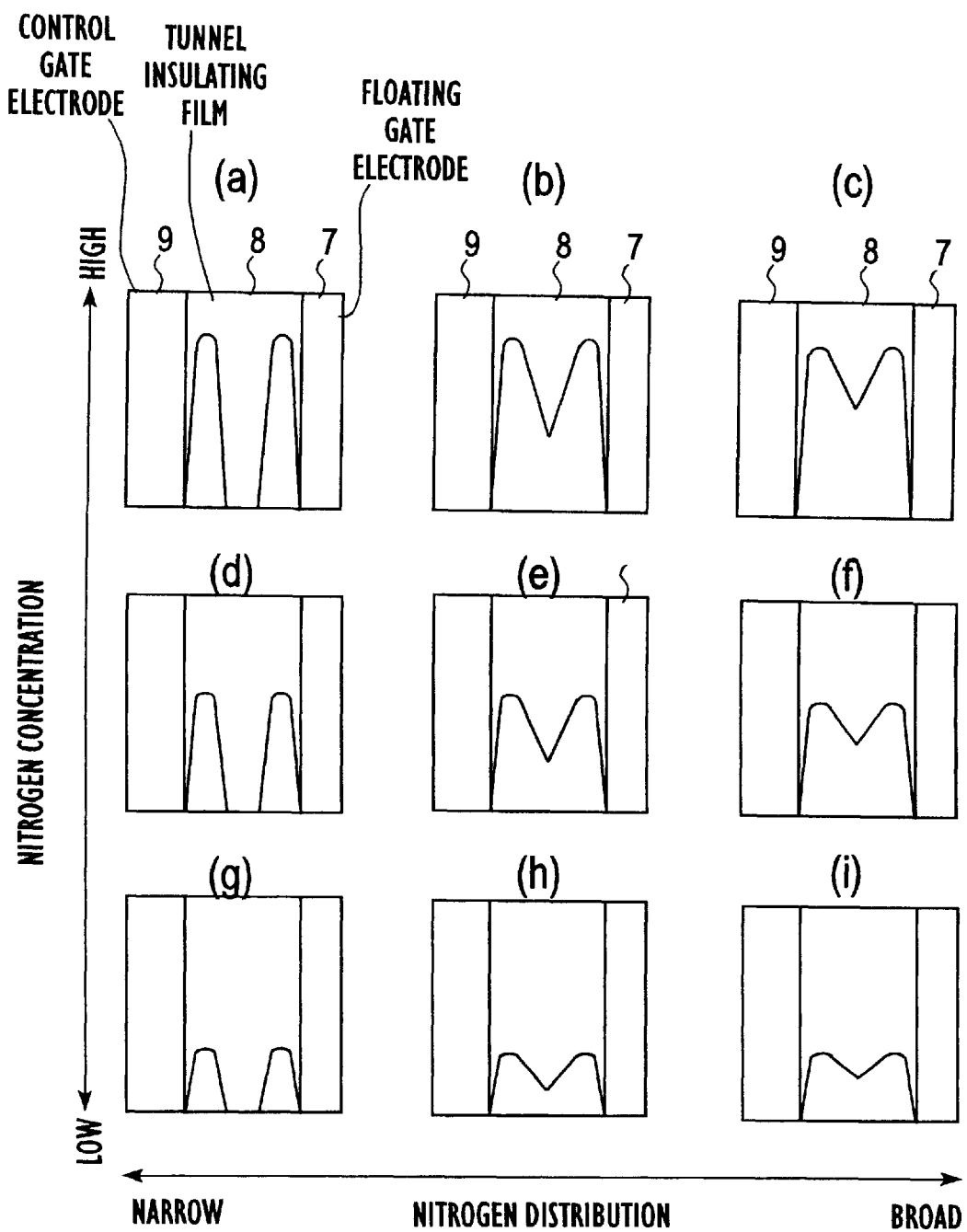
FIG. 16 shows relationship between the nitrogen concentration and nitrogen distribution in the tunnel insulating film according to a third example.

In the second embodiment, the floating gate electrode 70' contains no nitrogen atom, but the tunnel insulating film 8 contains nitrogen atoms. FIGS. 14 to 16 each show the relationship between the distribution and concentration of the nitrogen contained in the tunnel insulating film 8.

In FIG. 14 (a) to (i), the nitrogen concentration of the tunnel insulating film 8 shows a peak value near the floating gate electrode 70'.

In FIG. 15 (a) to (i), the nitrogen concentration of the tunnel insulating film 8 shows a peak value near the control gate electrode 9.

In FIG. 16 (a) to (i), the nitrogen concentration of the tunnel insulating film 8 shows peak values forming local maximum values near the floating gate electrode 70' and the control gate electrode 9.

Further, (a) to (c) in each of FIGS. 14 to FIG. 16 are cases where the nitrogen concentration is relatively high; whereas (g) to (i) are cases where the nitrogen concentration is relatively low; and (d) to (f) are cases where the nitrogen concentration is between that of (a) to (c) and that of (g) to (i). In FIGS. 14 to 16, (a), (d) and (g) are cases where the nitrogen distribution is narrow; whereas (c), (f) and (i) are cases where the nitrogen distribution is broad; and (b), (e) and (h) are cases where the nitrogen distribution is between that of (a), (d) and (g) and that of (c), (f) and (i).

In the structural transition layer present at the border between the floating gate electrode 70' and the tunnel insulating film 8, dangling bonds not having the O—Si—O bond are liable to occur. However, since the tunnel insulating film 8 contains nitrogen atoms at a part corresponding to the structural transition layer, the unbound bonds of the dangling bonds are terminated by trivalent nitrogen atoms. Thus, dangling bonds are eliminated from the structural transition layer.

Accordingly, as shown in FIG. 14 or 16, when the nitrogen concentration of the tunnel insulating film 8 shows a peak value near the floating gate electrode 70', the dangling bonds in the structural transition layer are advantageously eliminated. The nitrogen concentration is preferably set at the optimum value such that the following demerits may be avoided. If the nitrogen concentration is higher than the optimum value, the stress in the tunnel insulating film 8 is increased; whereas if it is lower than the optimum value, it will be difficult to achieve full termination of the unbound bonds of the dangling bonds.

As shown in FIG. 15 or 16, when the nitrogen concentration of the tunnel insulating film 8 shows a peak value near the control gate electrode 9, electron traps are advantageously prevented from occurring in the erasing operation. Further, in the case where the nitrogen distribution is broad, formation of electron traps in the area other than the area near the interface between the floating gate electrode 70' and the tunnel insulating film 8 can be controlled. Accordingly, in order to control formation of electron traps, it is preferred that the nitrogen distribution is broad or that the nitrogen concentration shows a peak value near the control gate electrode 9.

Next, a method for manufacturing the memory cell 252 according to the second embodiment will be described. In the second embodiment, Step 4 in the first embodiment is omitted.

After completion of Steps 1 to 3 and Step 5 in the same manner as in the first embodiment, the resulting device is subjected to thermal treatment in an atmosphere containing nitrogen ($N_2O$, NO, $NH_3$ or a gaseous mixture thereof) to impregnate the tunnel insulating film 8 with nitrogen atoms, prior to Step 6. In this process, the desired distribution and the desired concentration of nitrogen incorporated into the tunnel insulating film 8 can be achieved, as shown in FIGS. 15 and 16, by adjusting the thickness of the tunnel insulating film 8 and the thermal treatment conditions. Subsequently, Steps 6 to 11 are carried out in the same manner as in the first embodiment to complete the split gate type memory cell 61 of the second embodiment.

According to the second embodiment, since the tunnel insulating film 8 contains nitrogen atoms, the same effects as in the first embodiment are exhibited. Further, the thermal treatment in an atmosphere containing nitrogen to impregnate the tunnel insulating film 8 with nitrogen atoms facilitates achievement of the desired nitrogen distribution and nitrogen concentration.

The following three methods may be employed to impregnate the tunnel insulating film 8 with nitrogen atoms;

(a) The tunnel insulating film 8 is exposed to nitrogen plasma;

(b) The tunnel insulating film 8 is implanted with nitrogen ion; and/or (c) The doped polysilicon film 34 which is etched to form the control gate electrode 9 is impregnated with nitrogen atoms, and the nitrogen atoms in the doped polysilicon film 34 are diffused into the tunnel insulating film 8.

Figure 17:
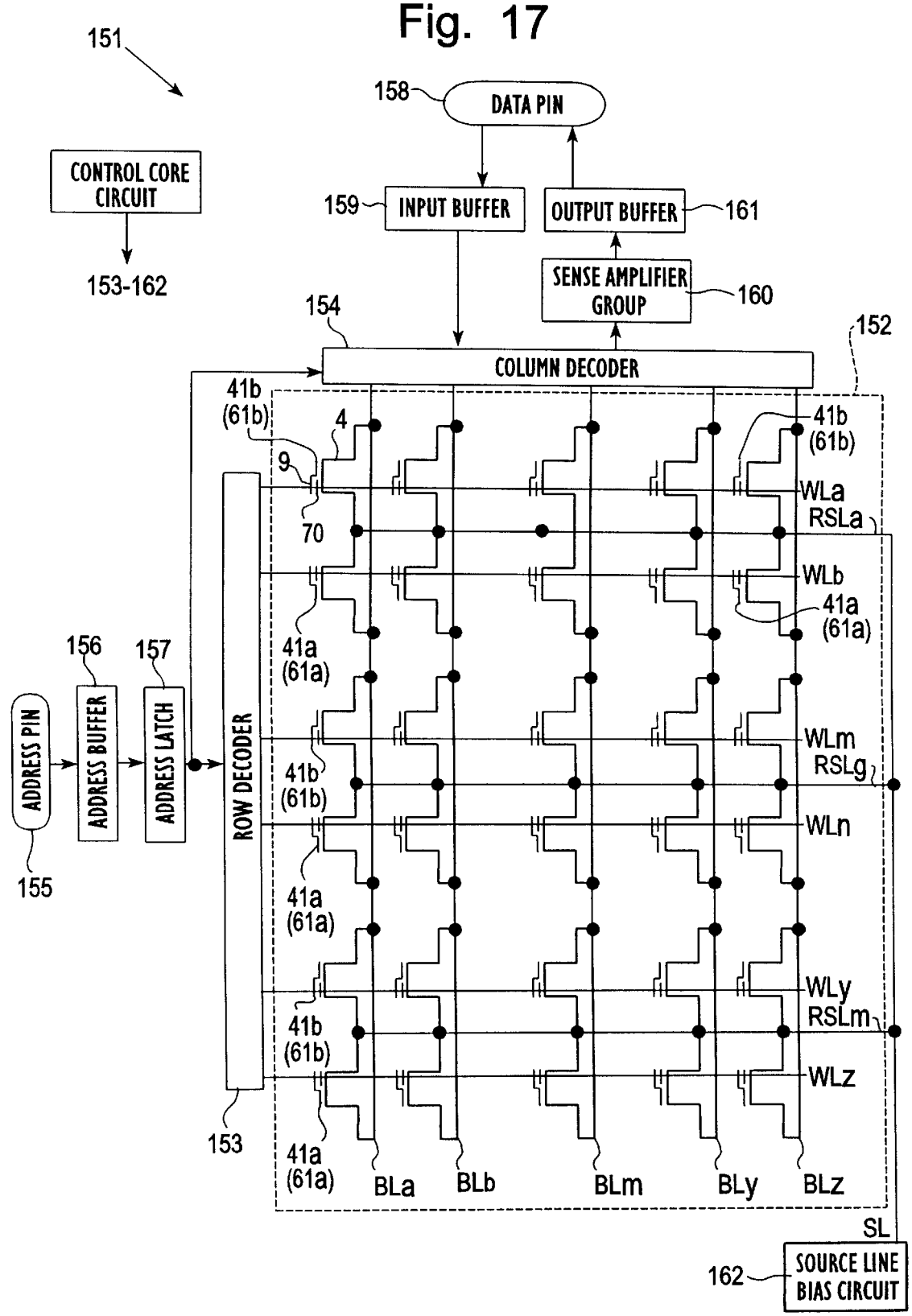
FIG. 17 is a schematic block diagram of a flash EEPROM having a plurality of split gate memory cells according to the present invention.

FIG. 17 is a block diagram showing a flash EEPROM 151 having a plurality of split gate memory cells 41*a*, 41*b* or 61*a*, 61*b*. The flash EEPROM 151 includes a memory cell array 152 (or 252), a row decoder 153, a column decoder 154, an address pin 155, an address buffer 156, an address latch 157, a data pin 158, an input buffer 159, a sense amplifier group 160, an output buffer 161, a source line bias circuit 162 and a control core circuit 163.

The memory cell array 152 has a matrix of split gate memory cells, a plurality of word lines WLa to WLz each commonly connected to the control gate electrodes 9 of an associated row of memory cells, a plurality of bit lines BLa to BLz each commonly connected to the drains 4 of an associated column of memory cells, and source lines RSLa to RSLm each connected to the common source 3 of each odd row of memory cells and each even row of memory cells. The individual source lines RSLa–RSLm are connected to a common source line SL. The word lines WLa–WLz are connected to the row decoder 153, and the bit lines BLa–BLz are connected to the column decoder 154. The common source line SL is connected to the source line bias circuit 162.

The address pin 155 receives a row address and a column address supplied from an external unit (not shown) and then supplies those addresses to the address buffer 156. The address buffer 156 transfers the row address and column address to the address latch 157. The address latch 157 latches those addresses and transfers the row address to the row decoder 153 and the column address to the column decoder 154. The row decoder 153 selects one word line in accordance with the row address and controls the voltage applied to the selected word line WLm in accordance with the individual operation modes. The column decoder 154 selects one bit line in accordance with the column address and controls the voltage applied to the selected bit line in accordance with the individual operation modes. The source line bias circuit 162 controls the voltage applied to the individual source lines RSLa–RSLm via the common source line SL in accordance with the individual operation modes.

The data pin 158 receives data supplied from the external unit (not shown) and supplies the data to the input buffer 159. The input buffer 159 transfers the data to the column decoder 154. The column decoder 154 controls the voltage applied to any selected one of the bit lines BLa–BLz according to that data.

Data read from an arbitrary memory cell is transferred from the selected bit line to the sense amplifier group 160 via the column decoder 154. The sense amplifier group 160 includes a plurality of sense amplifiers (not shown). The column decoder 154 connects the selected bit line to the sense amplifiers. The sense amplifier group 160 discriminates the data and supplies it to the output buffer 161. The output buffer 161 supplies the data to the data pin 158. The thus read data is supplied from the data pin 158 to an external unit.

The control core circuit 163 controls the operations of the row decoder 153, the column decoder 154, the address pin 155, the address buffer 156, the address latch 157, the data pin 158, the input buffer 159, the sense amplifier group 160, the output buffer 161 and the source line bias circuit 162 in a conventional manner.

The individual operation modes (erase mode, write mode and read mode) of the flash EEPROM 151 will now be discussed with reference to FIG. 18.

(a) Erase Mode

In erase mode, a voltage of the ground level (=0 V) is applied to all the source lines RSLa–RSLm and all the bit lines BLa–BLz. A voltage of +14 to +15 V is applied to a selected word line WLm and a voltage of the ground level is applied to the other, non-selected word lines WLa–WLl and WLn–WLz. Therefore, data is erased from all the memory cells 41a/61a that are connected to the selected word line WLm as the electric potentials of the control gate electrodes 9 of those memory cells 41a/61a are pulled up to +14 to +15 V.

When the electric potential of the control gate electrode 9 is +14 to 15 V and the electric potential of the drain is 0 V, a high electric field is produced between the control gate 9 and the floating gate electrode 70 so that a Fowler-Nordheim (FN) tunnel current flows between those gates. Consequently, electrons in the floating gate 70 are pulled out to the control gate 9, resulting in data erasure. At this time, the floating gate 70 has sharp lips 70b so that electrons are released from the sharp lips 70b and move to the control gate 9. The sharp lips 70b make electrons move easily, and it is possible to effectively pull out electrons in the control gate 9.

This erasing operation is based on the fact that the electrostatic capacitance between the source 3 and the substrate 2 and the floating gate 70 is significantly greater than that between the control gate 9 and the floating gate 70. Simultaneous selection of a plurality of word lines WLa–WLz allows for data erasure of all the memory cells that are connected to the selected individual word lines. This erasure is called "block erasure".

(b) Write Mode

In write mode, a voltage of the ground level is applied to a selected bit lines BLm and a voltage (in this case +2 V) equal or greater than voltage applied to the other, non-selected bit lines BLa–BLl and BLn–BLz. A voltage of +2 V is applied to a word line WLm connected to a control gate 9 of a selected memory cell and a voltage of the ground level is applied to the other, non-selected word lines WLa–WLl and WLn–WLz. A voltage of +12 V is applied to the common source line SL. Consequently, the electric potential of the floating gate 70 is pulled up by the capacitive coupling between the source 3 and the floating gate 70, thus producing a high electric field between the channel 5 and the floating gate 70. Thus, the electrons in the channel 5 are accelerated to become hot electrons which are supplied to the floating gate 70. As a result, charges are stored in the floating gate 70 of the selected memory cell and 1-bit of data is written.

It is noted that each memory cell has a threshold voltage Vth of +0.5 V and includes a transistor, which includes the control gate 9, the source 3 and the drain 4. Therefore, electrons in the drain 4 are moved in the channel 5 in the inverted state from P to N, so that the cell current Id flows to the drain 4 from the source 3.

(c) Read Mode

In read mode, a voltage of +4 V is applied to a selected word line WLm and the voltage of the ground level is applied to the other, non-selected word lines WLa–WLl and WLn–WLz. A voltage of +2 V is applied to a selected bit line BLm and the voltage of the ground level is applied to the other, non-selected bit lines BLa–BLl and BLn–BLz. As a result, the cell current which flows to the source 3 of the memory cell in the erased state from the drain 4 becomes greater than the cell current flowing in the memory cell in the written state. This is because the channel 5 directly below the floating gate 70 of the data-erased memory cell is enabled, while the channel 5 directly below the floating gate 70 of the data-written memory cell is disabled in the memory cell in the written state.

More specifically, because electrons are drained from the floating gate 70 of a data-erased memory cell, the floating gate 70 is positively charged. Therefore, the channel 5 is enabled. As electrons are supplied into the floating gate 70 of a data-written memory cell, the floating gate 70 is negatively charged. The channel 5 is thus disabled. Each sense amplifier in the sense amplifier group 160 discriminates the level of the cell current flowing in the associated memory cell as erase data "1" or write data "0". In this manner, binary data having a data value "1" indicating the erased state and a data value "0" indicating the written state may be stored in each memory cell.

(d) Stand-by Mode

In the stand-by mode, a ground level voltage is applied to the common source line SL, all the word lines WLa–WLz and all the bit lines BLa–BLz. Accordingly, in the stand-by mode, erasure operation, writing operation or read operation is not performed on any memory cells.

Since the split gate type memory cell described above has the selector transistor 11, it can make an ON/Off selection by itself. Accordingly, in the data erasure mode, even when excess charge is extracted from the floating gate electrode 70, the memory cell can select deenergization by turning off the selector transistor 11.

The first embodiment may be applied to a split gate type memory cell 41 in which the source area 3 and the drain area 4 are replaced with each other. FIG. 19A is a schematic cross-sectional view showing a part of the memory cell array 152 having a plurality of such split gate type memory cells; while FIG. 19B is a schematic plan view showing a part of that memory cell array 152. FIG. 19A is a cross section taken along the line 19A—19A in FIG. 19B.

The second embodiment may be applied to the split gate type memory cell 61 in which the source area 3 and the drain area 4 are replaced with each other. FIG. 20A is a schematic cross-sectional view showing a part of memory cell array 152 having a plurality of such split gate type memory cells; while FIG. 20B is a schematic plan view showing a part of that memory cell array 152. FIG. 20A is a cross section taken along the line 20A—20A in FIG. 20B.

Figure 21:
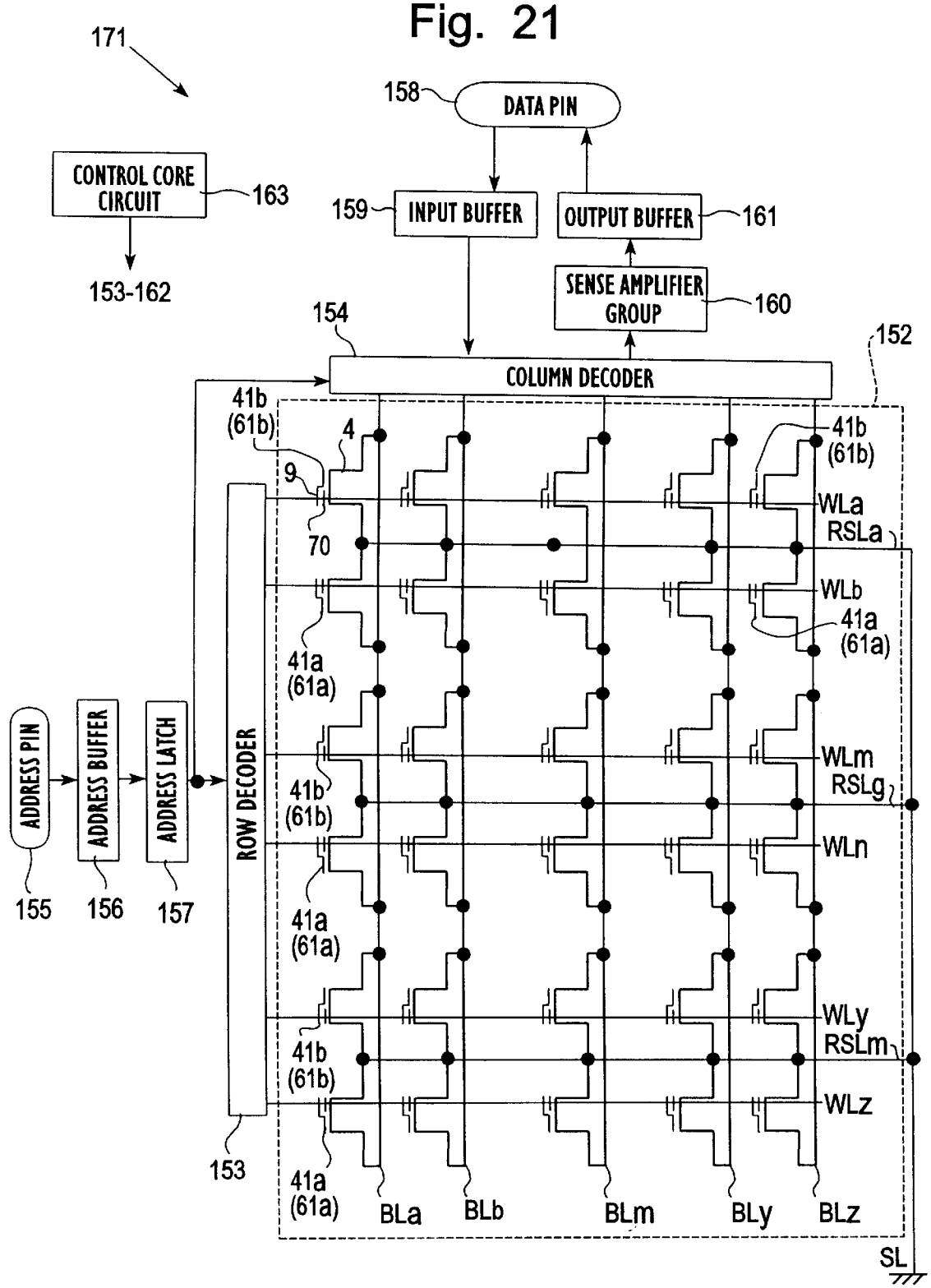
FIG. 21 is a schematic block circuit diagram of a flash EEPROM employing the memory cell array of either FIG. 19 or FIG. 20.

FIG. 21 is a block circuit diagram showing a flash EEPROM 171 employing the memory cell array 152 shown in FIG. 19 or FIG. 20. FIG. 22 is a drawing for explaining voltage control in the respective modes.

Referring now to FIG. 21, the flash EEPROM 171 is different from the flash EEPROM 151 in that the common source line SL is grounded in the former. In any operational mode, a ground level voltage is applied via the common source line SL to the respective source lines RSLa–RSLm. Further, in the write mode, a voltage of +12V is applied to the selected bit line BLm, and a ground level voltage is applied to unselected bit lines BLa–BL1 and BLn–Blz.

Although several embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method for manufacturing a split gate type transistor, comprising the steps of:
   forming a semiconductor substrate;
   forming a floating gate electrode over the semiconductor substrate, said floating gate electrode having at least one lateral face portion; and
   nitrating said at least one lateral face portion to form a nitrogen-containing layer, wherein the nitration of said at least one lateral face portion is achieved employing a method selected from the group consisting of nitrogen ion implantation and nitrogen plasma exposure.

2. A method for manufacturing a split gate type transistor, comprising the steps of:
   forming a semiconductor substrate;
   forming a floating gate electrode over the semiconductor substrate, said floating gate electrode having at least one lateral face portion; and
   nitrating said at least one lateral face portion to form a nitrogen-containing layer, wherein said floating gate electrode has a plurality of lateral face portions, wherein the nitration of said plurality of lateral face portions is achieved via nitrogen ion rotational oblique implantation.

3. A method for manufacturing a split gate type transistor, comprising the steps of:
   forming a semiconductor substrate;
   forming a conductive film on the semiconductor substrate employing at least one silicon selected from the group consisting of an amorphous silicon, a polysilicon and a single crystal silicon;
   subjecting said conductive film to patterning to form a floating gate electrode, said floating gate electrode having at least one lateral face portion;
   nitrating said at least one lateral face portion to form a nitrogen-containing layer, wherein the nitration of said at least one lateral face portion is achieved employing a method selected from the group consisting of nitrogen ion implantation and nitrogen plasma exposure; and
   forming a tunnel insulating film containing at least one selected from silicon oxide, silicon oxynitride and silicon nitride over said floating gate electrode by employing at least one method selected from thermal oxidation, thermal nitration, thermal oxynitration and CVD.

4. A method for manufacturing a split gate type transistor, comprising the steps of:
   forming a semiconductor substrate;
   forming a floating gate electrode over the semiconductor substrate, said floating gate electrode having at least one lateral face portion; and
   nitrating said at least one lateral face portion to form a nitrogen-containing layer, wherein said floating gate electrode has a plurality of lateral face portions; the nitration of said plurality of lateral face portions is achieved via nitrogen ion rotational oblique implantation.

5. A method for manufacturing a split gate type transistor, comprising the steps of:
   forming a semiconductor substrate;
   forming a floating gate electrode over the semiconductor substrate, said floating gate electrode having at least one lateral face portion;
   forming a tunnel insulating film on said semiconductor substrate to cover at least said floating gate electrode; and
   nitrating said tunnel insulating film, wherein the nitrogen atoms contained in said tunnel insulating film by nitration thereof are distributed such that a maximum nitrogen concentration is achieved near said at least one lateral face portion of the floating gate electrode.

6. The method according to claim 5, wherein the nitration of said tunnel insulating film is achieved via a method selected from the group consisting of nitrogen ion implantation, nitrogen plasma exposure and thermal treatment in an atmosphere containing nitrogen.

7. A method for manufacturing a split gate type transistor, comprising the steps of:
   forming a semiconductor substrate;
   forming a floating gate electrode over the semiconductor substrate, said floating gate electrode having at least one lateral face portion;
   nitrating said at least one lateral face portion to form a nitrogen-containing layer;
   forming a tunnel insulating film on said semiconductor substrate to cover at least said floating gate electrode; and
   nitrating said tunnel insulating film.

8. The method according to claim 7, wherein the nitration of said at least one lateral face portion and the nitration of said tunnel insulating film are achieved employing a method selected from the group consisting of nitrogen ion implantation, nitrogen plasma exposure and thermal treatment in an atmosphere nitrogen.

9. The method according to claim 7, wherein said floating gate electrode has a plurality of lateral face portions; the nitration of said plurality of lateral face portions are achieved via nitrogen ion rotational oblique implantation.

10. The method according to claim 7, wherein the nitrogen atoms contained in said tunnel insulating film by nitration thereof are distributed such that a maximum nitrogen concentration is achieved near said at least one lateral face portion.

11. The method according to claim 10, wherein the nitrogen atoms contained in said tunnel insulating film are widely distributed along a width of said tunnel insulating film.

12. The method according to claim 7, wherein the nitrogen atoms contained in said tunnel insulating film by nitration thereof are distributed such that the maximum nitrogen concentration is achieved on an opposing side of said at least one lateral face portion.

13. The method according to claim 12, wherein the nitrogen atoms contained in said tunnel insulating film are widely distributed along a width of said tunnel insulating film.

14. The method according to claim 7, wherein the nitrogen atoms contained in said tunnel insulating film by nitration thereof are distributed such that a maximum nitrogen concentration is achieved near said at least one lateral face portion and on an opposing side of said at least one lateral face portion.

15. The method according to claim 14, wherein the nitrogen atoms contained in said tunnel insulating film are widely distributed along a width of said tunnel insulating film.

16. A method of manufacture of a non-volatile semiconductor memory device having a plurality a split gate transistors employable as memory cells, comprising the steps of:

(a) forming a substrate from a semiconductor material;

(b) forming a gate insulating film layer on said semiconductor material substrate;

(c) forming a doped polysilicon film layer on said gate insulating film layer;

(d) forming a silicon nitride film layer on said doped polysilicon film layer;

(e) applying a resist material layer over said silicon nitride film layer, and exposing said resist material layer by photolithographic procedures to form an etching mask;

(f) etching said silicon nitride film layer to remove said etching mask;

(g) oxidizing said polysilicon film layer to form an insulating film layer;

(h) forming floating gate electrodes for said split gate transistors by removing said silicon nitride film layer, and etching said doped polysilicon film layer using said insulating film layer as an etching mask, said floating gate electrodes formed by the doped polysilicon film layer remaining under said insulating film layer, each of said floating gate electrodes having an upper face portion, a lower face portion, and lateral side portions;

(i) implanting nitrogen ions into said lateral sides of each of said floating gate electrodes;

(j) forming a tunnel insulating film layer over an outer surface of said semiconductor memory device;

(k) forming a doped polysilicon film layer over said tunnel insulating film layer;

(l) applying an etching mask over said doped polysilicon film layer, and etching said etching mask to remove portions of said doped polysilicon film layer, with the portions of said doped polysilicon film layer that remain forming control gate electrodes disposed over a portion of said floating gate electrodes along the upper face portion and a portion of said lateral side portions of said floating gate electrodes;

(m) forming a source area of said split gate transistors by masking the outer surface of said semiconductor memory device along which lie said floating gate electrodes with a mask, depositing a dopant and removing said mask, such that said source area lays underneath said gate insulating film layer; and (n) forming a drain area of said split gate transistors by masking said outer surface of said semiconductor memory device with a mask, depositing a dopant and removing said mask, with said drain area bounded by said control gate electrodes, separated from said source area, and lying underneath said gate insulating film layer.

17. A method of manufacture of a non-volatile semiconductor memory device having a plurality a split gate transistors employable as memory cells, comprising the steps of:

(a) forming a substrate from a semiconductor material;

(b) forming a gate insulating film layer on said semiconductor material substrate;

(c) forming a doped polysilicon film layer on said gate insulating film layer;

(d) forming a silicon nitride film layer on said doped polysilicon film layer;

(e) applying a resist material layer over said silicon nitride layer and exposing said resist layer by photolithographic procedures to form an etching mask;

(f) etching said silicon nitride film layer to remove said etching mask;

(g) oxidizing said polysilicon film layer to form an insulating film layer;

(h) forming floating gate electrodes for said split gate transistors by removing said silicon nitride film layer, and etching said doped polysilicon film layer using said insulating film layer as an etching mask, said floating gate electrodes formed by the doped polysilicon film layer remaining under said insulating film layer, each of said floating gate electrodes having an upper face portion, a lower face portion, and lateral side portions;

(i) forming a tunnel insulating film layer over an outer surface of said semiconductor memory device;

(j) implanting nitrogen ions into said tunnel insulating film;

(k) forming a doped polysilicon film layer over said tunnel insulating film layer;

(l) applying an etching mask over said doped polysilicon film, and etching said etching mask to remove portions of said doped polysilicon film layer, with the portions of said doped polysilicon film layer that remain forming control gate electrodes disposed over a portion of said floating gate electrodes along the upper face portion and a portion of said lateral side portions of said floating gate electrodes;

(m) forming a source area of said split gate transistors by masking the outer surface of said semiconductor memory device along which lie said floating gate electrodes with a mask, depositing a dopant and removing said mask, said source area lying underneath said gate insulating film layer; and (n) forming a drain area of said split gate transistors by masking said outer surface with a mask, depositing a dopant and removing said mask, with said drain area bounded by said control gate electrodes, separated from said source area, and lying underneath said gate insulating film layer.

* * * * *

UNITED STATES PATENT AND TRADEMARK OFFICE
CERTIFICATE OF CORRECTION

| | |
|---|---|
| PATENT NO. : 6,184,088 B1 | Page 1 of 1 |
| DATED : February 6, 2001 | |
| INVENTOR(S) : Kurooka et al. | |

It is certified that error appears in the above-identified patent and that said Letters Patent is hereby corrected as shown below:

<u>Title page, item [54],</u>

<u>Column 1,</u>
Line 1-2; (54), Method For Manufacturing A Split Gate Type Transistor

Signed and Sealed this

Fourth Day of September, 2001

*Attest:*

*Attesting Officer*

NICHOLAS P. GODICI
*Acting Director of the United States Patent and Trademark Office*